(12) United States Patent
Salemme et al.

(10) Patent No.: US 9,285,363 B2
(45) Date of Patent: Mar. 15, 2016

(54) METHOD OF PROTEIN NANOSTRUCTURE FABRICATION

(75) Inventors: F. Raymond Salemme, Yardley, PA (US); Patricia C. Weber, Yardley, PA (US)

(73) Assignee: IMIPLEX LLC, Yardley, PA (US)

(*) Notice: Subject to any disclaimer, the term of this patent is extended or adjusted under 35 U.S.C. 154(b) by 388 days.

(21) Appl. No.: 13/319,989

(22) PCT Filed: May 10, 2010

(86) PCT No.: PCT/US2010/034248
§ 371 (c)(1),
(2), (4) Date: Nov. 10, 2011

(87) PCT Pub. No.: WO2010/132363
PCT Pub. Date: Nov. 18, 2010

(65) Prior Publication Data
US 2012/0059156 A1    Mar. 8, 2012

Related U.S. Application Data

(60) Provisional application No. 61/177,256, filed on May 11, 2009.

(51) Int. Cl.
*B82Y 5/00* (2011.01)
*G01N 33/543* (2006.01)
(Continued)

(52) U.S. Cl.
CPC ...... *G01N 33/54386* (2013.01); *B81C 1/00206* (2013.01); *B82Y 30/00* (2013.01); *B01J 2219/0063* (2013.01);
(Continued)

(58) Field of Classification Search
CPC . B82Y 5/00; B82Y 30/00; B01J 2219/00605; B01J 2219/00626; B01J 2219/00637; B01J 2219/00657; B01J 2219/00659; B01J 2219/00623; B01J 2219/00725; B81C 1/00206; B81C 1/00214; G01N 33/543; G01N 33/54353
USPC ......... 977/773, 700, 890, 892, 896, 904, 924; 436/501
See application file for complete search history.

(56) References Cited

U.S. PATENT DOCUMENTS 4,839,293 A  6/1989 Cantor et al.
4,933,275 A  6/1990 Wands et al.
(Continued)

FOREIGN PATENT DOCUMENTS

WO   WO-2006/058226 A2   6/2006
WO   WO-2008/112980 A2   9/2008
(Continued)

OTHER PUBLICATIONS

Sletyr et al., S-layers as a basic building block in a molecular construction kit, 2007, FEBS Journal, vol. 274, pp. 323-334.*
(Continued)

*Primary Examiner* — Erik B Crawford
(74) *Attorney, Agent, or Firm* — Venable, LLP; Lars H. Genieser; Michael Golin

(57) ABSTRACT

A method of assembling a protein nanostructure on a surface including selectively patterning a surface with a fixation site, bringing a protein node into contact with the surface, and allowing the protein node to bond with the fixation site, so that the position and/or orientation of the protein node is constrained, and compositions.

13 Claims, 12 Drawing Sheets a.      b.

c.      d.

(51) Int. Cl.
*B81C 1/00* (2006.01)
*B82Y 30/00* (2011.01)

(52) U.S. Cl.
CPC ............... *B01J 2219/00605* (2013.01); *B01J 2219/00612* (2013.01); *B01J 2219/00617* (2013.01); *B01J 2219/00626* (2013.01); *B01J 2219/00637* (2013.01); *B01J 2219/00725* (2013.01); *B81B 2201/0214* (2013.01)

(56) References Cited

U.S. PATENT DOCUMENTS

| | | | |
|---|---|---|---|
| 5,258,627 | A | 11/1993 | Turin |
| 5,672,691 | A | 9/1997 | Kopetzki et al. |
| 5,891,993 | A | 4/1999 | Dawson et al. |
| 5,948,668 | A | 9/1999 | Hartman et al. |
| 5,948,688 | A | 9/1999 | Weber et al. |
| 6,022,951 | A | 2/2000 | Sano et al. |
| 6,156,493 | A | 12/2000 | Stayton |
| 6,165,750 | A | 12/2000 | Stayton |
| 6,211,388 | B1 | 4/2001 | Tsuji et al. |
| 6,218,506 | B1 | 4/2001 | Krafft et al. |
| 6,232,085 | B1 | 5/2001 | Pantoliano et al. |
| 6,268,158 | B1 | 7/2001 | Pantoliano et al. |
| 6,291,192 | B1 | 9/2001 | Pantoliano et al. |
| 6,485,984 | B1 | 11/2002 | Kim |
| 6,490,532 | B1 | 12/2002 | Hogue et al. |
| 6,492,492 | B1 | 12/2002 | Stayton |
| 6,653,127 | B1 | 11/2003 | Malcolm et al. |
| 6,743,771 | B2 | 6/2004 | Douglas et al. |
| 6,756,039 | B1 | 6/2004 | Yeates et al. |
| 6,849,458 | B2 | 2/2005 | Pantoliano et al. |
| 6,859,736 | B2 | 2/2005 | Blankenbecler et al. |
| 7,039,621 | B2 | 5/2006 | Agrafiotis et al. |
| 7,045,537 | B1 | 5/2006 | Woolfson et al. |
| 7,122,321 | B2 | 10/2006 | Pantoliano et al. |
| 7,138,255 | B2 | 11/2006 | Vodyanoy et al. |
| 7,139,739 | B2 | 11/2006 | Agrafiotis et al. |
| 7,144,991 | B2 | 12/2006 | Goshorn et al. |
| 7,188,055 | B2 | 3/2007 | Agrafiotis et al. |
| 7,217,557 | B1 | 5/2007 | Noel et al. |
| 7,803,575 | B2 | 9/2010 | Borchert et al. |
| 8,993,714 | B2 | 3/2015 | Salemme et al. |
| 2001/0047074 | A1 | 11/2001 | Kissel et al. |
| 2002/0037908 | A1 | 3/2002 | Douglas et al. |
| 2003/0027194 | A1 | 2/2003 | Kurz et al. |
| 2003/0077803 | A1 | 4/2003 | Walker et al. |
| 2003/0171257 | A1 | 9/2003 | Stirbl et al. |
| 2003/0198967 | A1* | 10/2003 | Matson et al. ............ 435/6 |
| 2004/0014186 | A1 | 1/2004 | Kumar |
| 2004/0152872 | A1 | 8/2004 | Wohlfahrt et al. |
| 2005/0027103 | A1 | 2/2005 | Tang et al. |
| 2005/0048078 | A1 | 3/2005 | Sakasegawa et al. |
| 2005/0053525 | A1 | 3/2005 | Segal et al. |
| 2005/0130258 | A1 | 6/2005 | Trent et al. |
| 2005/0192757 | A1 | 9/2005 | Umeyama et al. |
| 2005/0221343 | A1 | 10/2005 | Waldo et al. |
| 2006/0003381 | A1 | 1/2006 | Gilmore et al. |
| 2006/0009620 | A1 | 1/2006 | Woolfson et al. |
| 2006/0030053 | A1 | 2/2006 | Seymour et al. |
| 2006/0089808 | A1 | 4/2006 | Agrafiotis et al. |
| 2006/0134072 | A1 | 6/2006 | Pedrozo et al. |
| 2007/0087356 | A1 | 4/2007 | Chatterjee et al. |
| 2007/0178572 | A1 | 8/2007 | Gamblin et al. |
| 2007/0256250 | A1 | 11/2007 | Knight |
| 2008/0003662 | A1 | 1/2008 | Trachtenberg |
| 2008/0248972 | A1* | 10/2008 | Nishizawa et al. ............ 506/32 |
| 2010/0256342 | A1 | 10/2010 | Salemme et al. |
| 2010/0329930 | A1 | 12/2010 | Salemme et al. |
| 2011/0085939 | A1 | 4/2011 | Salemme et al. |
| 2012/0059156 | A1 | 3/2012 | Salemme et al. |
| 2014/0178962 | A1 | 6/2014 | Salemme et al. |

FOREIGN PATENT DOCUMENTS

| | | |
|---|---|---|
| WO | WO-2009/055068 A1 | 4/2009 |
| WO | WO-2010/019725 A2 | 2/2010 |

OTHER PUBLICATIONS

Adams et al., "Structure of the Pleckstrin Homology Domain from Phospholipase C Delta in Complex with Inositol Trisphosphate" Protein Data Bank, Code: 1MAIL, Last Modified on Feb. 24, 2009 (www.rcsb.org/pdb/explore/explore.do?structureId=1mai).

Benach et al., "The 2.35 Å structure of the TenA homolog from Pyrococcus furiosus supports an enzymatic function in thiamine metabolism" (2005) *Acta Crystallogr.,Sect.D* 61: 589-598 (pdb code:lrtw).

Blum et al., "An engineered virus as a scaffold for three-dimensional self-assembly on the nanoscale" *Small* (2005)1:702.

Blum et al., "Cowpea mosaic virus as a scaffold for 3-D patterning of gold nanoparticles" *Nano Lett* (2004)4:867.

Case et al., "The Amber biomolecular simulation programs" (2005) *J. Computat. Chem.* 26, 1668-1688 (http://amber.scripps.edu/).

Castro et al., "Homogeneous biocatalysis in organic solvents and water-organic mixtures" *Crit Rev Biotechnol* (2003)23:195-231.

Chatterji et al., "A virus-based nanoblock with tunable electrostatic properties" *Nano Lett* (2005)5:597.

Chatterji et al., "New addresses on an addressable virus nanoblock; uniquely reactive Lys residues on cowpea mosaic virus" *Chem Biol* (2004)11:855.

Cherny et al., "Analysis of Various Sequence-Specific Triplexes by Electron and Atomic Force Microscopies" *Biophysical J* (1998)74:1015-1023.

Cosgrove et al., "The structural basis of sirtuin substrate affinity" (2006) *Biochemistry* 45: 7511-7521 (pdb code: 2h2i).

Deng Y, Wang Y, Holtz B, Li J, Traaseth N, Veglia G, Stottrup BJ, Elde R, Pei, Guo A, Zhu X-Y "Fluidic and Air-Stable Supported Lipid Bilayer and Cell-Mimicking Microarrays" *J Am Chem Soc* (2008) Apr. 12, 2008 web publication.

Eigler et al., "Positioning single atoms with a scanning tunnelling microscope" *Nature* (1990)344:524-526.

Esposito et al., "Structural study of a single-point mutant of Sulfolobus solfataricus alcohol dehydrogenase with enhanced activity" (2003) *Febs Lett.* 539: 14-18 (pdb code: 1into).

Falkner et al., "Virus crystals as nanocomposite scaffolds" *J Am Chem Soc* (2005)127:5274.

Fitzpatrick et al., "Enzyme Crystal Structure in a Neat Organic Solvent" *Proc Nat Acad Sci USA* (1993)90:8653.

Gonzalez et al., "Interaction of Biotin with Streptavidin" *J Biol Chem* (1997)272:112288-11294.

Green NM "A Spectrophotometric Assay for Avidin and Biotin Based on Binding of Dyes by Avidin" *Biochem J* (1965)294:23c-24c.

Green NM "Avidin and Streptavidin" *Meth Enzymol* (1990)243:51-67.

Green NM "Avidin" *Adv Prot Chem* (1975)29:85-133.

Gupta MN, Roy I "Enzymes in organic media: Forms, functions and applications" *Eur J Biochem* (2004)271:2575-2583.

Hartmann et al., "Imaging and manipulation properties of nanoparticles in scanning tunneling microscopy" *Nanotechnology* (1996)7:376-380.

Hatzor-de Picciotto et al., "Arrays of $Cu^{2+}$-Complexed Organic Clusters Grown on Gold Nano Dots" (2007) Journal of Experimental Nanoscience, 2: 3-11.

Hla et al., "STM Control of Chemical Reactions: Single-Molecule Synthesis" *Annu Rev Phys Chem* (2003)54:307-309.

Hofmann et al., "Iminobiotin affinity columns and their application to retrieval of streptavidin" *Proc Natl Acad Sci USA* (1980)77:4666-4668.

Humphrey et al., "VMD: visual molecular dynamics" J Mol Graph. Feb. 1996;14(1):33-8-27-8. Retrieved From: http://www.ks.uiuc.edu/Research/vmd/.

International Preliminary Report on Patentability issued in International Application No. PCT/US2009/053628 dated Nov. 1, 2011.

International Preliminary Report on Patentability issued in International Application No. PCT/US2008/012174 dated Apr. 27, 2010.

(56) References Cited

OTHER PUBLICATIONS

International Preliminary Report on Patentability issued in International Application No. PCT/US2010/034248 dated Nov. 15, 2011.
International Search Report issued in International Application No. PCT/US2008/012174 dated, Feb. 20, 2009.
International Search Report issued in International Application No. PCT/US2009/053628 dated Jul. 14, 2010.
International Search Report issued in International Application No. PCT/US2010/034248 dated Aug. 19, 2010.
International Technology Roadmap for Semiconductors (<http://www.itrs.net/reports.html>), pp. 1-3, accessed Sep. 25, 2012.
Izard et al., "Principles of quasi-equivalence and Euclidean geometry govern the assembly of cubic and dodecahedral cores of pyruvate dehydrogenase complexes" (1999) *Proc. Natl. Acad. Sci.USA 96: 1240-1245* (pdb code: 1b5s).
Jones A "O: A Macromolecule Modeling Environment," Crystallographic and Modeling Methods in Molecular Design, 1990, pp. 189-199.
Jones, et al., "Using known substructures in protein model building and crystallography," The EMBO Journal, vol. 5, No. 4, 1986 pp. 819-822.
Judy JW, "Microelectromechanical systems (MEMS): fabrication, design and applications" (2001) *Smart Mater. Struct.* 10 1115-1134.
Kim et al., "Crystal structure of a small heat-shock protein" (1998) *Nature 394: 595-599* (pdb code: 1shs).
Kisker et al., "A left-hand beta-helix revealed by the crystal structure of a carbonic anhydrase from the archaeon *Methanosarcina thermophila*" (1996) EMBO J. v15 pp. 2323-30 (pdb code: 1thj).
Kitago et al., "Structure of 5'-deoxy-5'-methylthioadenosine phosphorylase homologue from *Sulfolobus tokodaii*" Protein Data Bank, Code: 1V4N, Last Modified on Feb. 24, 2009 (www.rcsb.org/pdb/explore/explore.do?structureId=1v4n)*Sulfolobus tokodaii* Protein Data Bank, Code: 1V4N, Last Modified on Feb. 24, 2009.
Lawrence et al., "Shape complementarity at protein/protein interfaces" *J Mol Biol* (1993)234:946-950.
Lee et al., "Protein Nanoarrays Generated by Dip-Pen Nanolithography" Science (2002)295:1702-1705.
Lee et al., "The interpretation of protein structures: Estimation of static accessibility (1971)"J. Mol. Biol. 55, 379-400.
Levene et al., "Zero-Mode Waveguides for Single-Molecule Analysis at High Concentrations" (2003) Science 299: 682-686.
Liu et al., "Nanofabrication of Self-Assembled Monolayers Using Scanning Probe Lithography" Nanotechnology (1996)7:376-380.
Liu et al., "Positioning protein molecules on surfaces: A nanoengineering approach to supramolecular chemistry" Proc Nat Acad Sci (2002)99:5165-5170.
Loo et al., "Effect of reducing disulfide-cotaining proteins on electrospray ionization spectra" Anal Chem (1990)62:693-698.
Massant et al., "Refined structure of Pyrococcus furiosus ornithine carbamoyltransferase at 1.87 A" (2003) Acta Crystallogr., Sect.D 59: 2140-2149 (pdb code: 1pvv).
Medalsy et al., "SP1 Protein-Based Nanostructures and Arrays" (2008) Nano Lett., 8 (2), 473-477.
Merrifield et al., "An instrument for automated synthesis of peptides" Anal Chem (1966)38:1905-1914.
Merrifield et al., "Automated Peptide Synthesis" Nature (1965)207:522-523.
Ni et al., "Structure of the arginine repressor from Bacillus stearothermophilus." (1999) Nat.Struct.Biol. 6: 427-432 (pdb code: 1b4b).
Nordlund, HR, et. al. Construction of a Dual Chain Pseudotetrameric Chicken Avidin by Combining Two Circularly Permuted Avidins J. Biol. Chem. 279:36715-36719 (2004).
Padilla et al., "Nanohedra: Using symmetry to design self-assembling protein cages, layers, crystals, and filaments" Proc Nat Acad Sci USA (2001)98:2217-2221.
Pantoliano et al., "High Density Miniaturized Thermal Shift Assay as a General Strategy for Drug Discovery" J Biomol Screening (2001)6:429-440.
Phillips et al., "The Biological Frontiers of Physics" Physics Today (May 2006) p. 38-43.
Protein Data Bank. <http://www.rcsb.org/pdb/>, pp. 1-2, accessed Sep. 25, 2012.
Ringler et al., "Self-Assembly of Proteins into Designed Networks" Science (2003)302:106-109.
Rogers et al., "Recent progress in Soft Lithography" (2005) *Materials Today* 8:50-56.
Rothemund Pwk "Folding DNA to create nanoscale shapes and patterns" *Nature* (2006)440:297-302.
Rupley et al., "Protein hydration and function" *Adv Protein Chem* (1991)41:37-172.
Saridakis et al., "Insights into ligand binding and catalysis of a central step in NAD+ synthesis: structures of Methanobacterium thermoautotrophicum NMN adenylyltransferase complexes." (2001) J.Biol.Chem. 276: 7225-7232 (pdb code: 1hyb).
Saveanu et al., "Structural and nucleotide-binding properties of YajQ and YnaF, two *Escherichia coli* proteins of unknown function" Prot Sci (2002)11:2551-2560.
Schulten K "VMD" <http://www.ks.uiuc.edu/Research/vmd/>, pp. 1-2, accessed Sep. 25, 2012.
Schwarzenbacher et al. "Crystal structure of a phosphoribosylaminoimidazole mutase PurE (TM0446) from Thermotoga maritima at 1.77 A resolution" (2004) Proteins 55: 474-478 (pdb code: 1o4v).
Schwarzenbacher et al., "Crystals Structure of Uronate Isomerase (TM0064) From Thermotoga maritima at 2.85 A Resolution" Proteins: Struct, Funct & Bioinform (2003)53:142-145.
Seeman NC "From Genes to Machines: DNA Nanomechanical Devices" Trends in Biochemical Sciences (2005a)30:119-235.
Seeman NC "Structural DNA Nanotechnology: An Overview" Methods in Molecular Biology 303: Bionanotechnology Protocols, Editors, Sandra J. Rosenthal and David W. Wright, Humana Press, Totowa, NJ (2005b) pp. 143-166.
Shih et al., "1.7-kilobase single-stranded DNA that folds into a nanoscale octahedron" Nature (2004)427:618-621.
Siegele "Universal Stress Proteins in *Escherichia coli*" J Bacteriol (2005) 187:6253-6254.
Skerra et al., "Use of the Strep-tag and Streptavidin for Detection and Purification of Recombinant Proteins" Meth. Enzymology (2000)326:271-204.
Sleytr et al., "S Layers as Basic Building Block for a Molecular Construction Kit" (2008) FEBS J. 274:323-334.
Sligar et al., "Protein engineering for molecular electronics" Curr Opin Biotechnol (1992)3:388-393.
Smith et al., Surface Plasmon Resonance Imaging as a Tool to Monitor Biomolecular Interactions in an Array Based Format. Appl. Spectroscopy, 2003, 57, 320A-332A.
Soukka et al., "Utilization of Kinetically Enhanced Monovalent Binding Affinity by Immunoassays Based on Multivalent Nanoparticle-Antibody Bioconjugates" Anal Chem (2001) 73:2254-2260.
Sousa et al., "Structure of the universal stress protein of Haemophilus influenzae" Structure (2001)9:1135-1141.
Teplyakov et al., "Crystal structure of inorganic pyrophosphatase from Thermus thermophilus" (1994) Protein Sci. 3: 1098-1107 (pdb code: 2prd).
Wada et al., "Crystal Structure of IPP isomerase at P43212" Protein Data Bank, Code: 1VCG, Last Modified on Jul. 13, 2011 (www.rcsb.org/pdb/explore/explore.do?structureId=1vcg).
Weber et al., "Crystallographic and Thermodynamic Comparison of Natural and Synthetic Ligands Bound to Streptavidin" J Amer Chem Soc (1992)114:3197-3200.
Weber et al., "Structural Origins of High Affinity Biotin Binding to Streptavidin" Science (1989)243:85-88.
Weber et al., "Structure-Based Design of Synthetic Azobenzene Ligands for Streptavidin" *J Amer Chem Soc* (1994)116:2717-2724.
Weber S (1999) <http://jcrystal.com/steffenweber/gallery/Fullerenes/Fullerenes.html>, pp. 1-4, accessed Sep. 25, 2012.
Whitesides et al., "Beyond molecules: Self-assembly of mesoscopic and macroscopic components" *Proc Nat Acad Sci USA* (2002)99:4769-4774.

(56) References Cited

OTHER PUBLICATIONS

Whitesides et al., "Molecular Self Assembly and Nanochemistry: A chemical strategy for the synthesis for the synthesis of nanostructures" (1991) *Science* 254, 1312-1319.

Xia et al., "Soft Lithography" (1998) *Annu. Rev. Mater. Sci.* 28, 153-184.

Zarembinski et al., "Structure-based assignment of the biochemical function of a hypothetical protein: A test case of structural genomics" *Proc Natl Acad Sci USA* (1998)95:15189-15193.

Zhu et al., "Crystal Structure of Tt0030 from *Thermus thermophilus*" Protein Data Bank, Code: 2IEL, Last Modified on Feb. 24, 2007 (www.rcsb.org/pdb/explore/explore.do?structureId=2iel).

Restriction Requirement issued in U.S. Appl. No. 12/589,529 dated Jul. 26, 2011.

Restriction Requirement issued in U.S. Appl. No. 12/766,658 dated Jul. 31, 2012.

Ferguson et al., "Structure of the Pleckstrin Homology Domain from Phospholipase C Delta in Complex with Inositol Trisphosphate" Protein Data Bank 1MAI, Last Modified on Feb. 24, 2009 (www.rcsb.org/pdb/explore/explore.do?structureId=1mai), accessed from the Internet on Nov. 30, 2012.

Blum et al., "An engineered virus as a scaffold for three-dimensional self-assembly on the nanoscale" *Small* (2005)1:702-706.

Blum et al., "Cowpea mosaic virus as a scaffold for 3-D patterning of gold nanoparticles" Nano Lett (2004)4:867-870.

Chatterji et al., "A virus-based nanoblock with tunable electrostatic properties" Nano Lett (2005)5:597-602.

Chatterji et al., "New addresses on an addressable virus nanoblock; uniquely reactive Lys residues on cowpea mosaic virus" Chem Biol (2004)11:855-863.

Deng et al., "Fluidic and Air-Stable Supported Lipid Bilayer and Cell-Mimicking Microarrays" J Am Chem Soc (2008) 130:6267-6271 (Apr. 12, 2008 web publication).

Falkner et al., "Virus crystals as nanocomposite scaffolds" J Am Chem Soc (2005)127:5274-5275.

Fitzpatrick et al., "Enzyme Crystal Structure in a Neat Organic Solvent" Proc Nat Acad Sci USA (1993)90:8653-8657.

Humphrey et al., "VMD: visual molecular dynamics" J Mol Graph. (1996) 14:33-38.

International Search Report issued in International Application No. PCT/US2008/012167 dated Feb. 20, 2009.

Liu et al., "Nanofabrication of Self-Assembled Monolayers Using Scanning Probe Lithography" Acc. Chem. Res. 2000, 33:457-466.

Seeman NC "From Genes to Machines: DNA Nanomechanical Devices" Trends in Biochemical Sciences (2005)30:119-125.

Skerra et al., "Use of the Strep-tag and Streptavidin for Detection and Purification of Recombinant Proteins" *Meth. Enzymology* (2000) 326:271-304.

Sligar et al., "Protein engineering for molecular electronics" *Curr Opin Structural Biology* (1992) 2:587-592.

Wada et al., "Crystal Structure of IPP isomerase at P43212" Protein Data Bank, Code: 1VCG, Last Modified on Jul. 13, 2011 (www.rcsb.org/pdb/explore/explore.do?structreId=1vcg), accessed from the Internet on Nov. 30, 2012.

Zaks et al., "Enzymatic catalysis in organic solvents" Proc. Nat. Acad. Sci USA (1985) 82: 3192-3196.

Zhu et al., "Crystal Structure of Tt0030 from Thermus thermophilus" Protein Data Bank, Code: 2IEL, Last Modified on Feb. 2009 (www.rcsb.org/pdb/explore/explore.do?structureId?2iel), accessed from the Internet on Nov. 30, 2012.

Restriction Requirement in U.S. Appl. No. 13/398,820 dated Apr. 10, 2015.

Notice of Allowance in U.S. Appl. No. 12/892,911 dated Apr. 7, 2015.

Office Action in U.S. Appl. No. 13/398,820 dated Aug. 27, 2015.

Office Action in U.S. Appl. No. 13/797,283 dated Jul. 27, 2015.

Dotan et al., "Self-Assembly of a Tetrahedral Lectin into Predesigned Diamondlike Protein Crystals," Angewwandte Chemie International Edition, vol. 38, Iss. 16, pp. 2363-2366 (1999) and online abstract at http://www3.interscience.wiley.com/cgi-bin/abstract/63001579/ABSTRACT accessed Jul. 29, 2005.

Livnah et al., "Three-dimensional structures of avidin and the avidin-biotin complex," Proc. Natl. Acad. Sci. USA, vol. 90, pp. 5076-5080 (1993).

Ringler et al., "Self-Assembly of Proteins into Designed Networks", Science, 302 (2003) 106-109: Supporting Online Material, 8 pages.

Halford, "Catalyst Goes Viral", Chemical & Engineering News, (Jun. 14, 2010) 13.

Adams et al., "Structure and properties of the atypical iron superoxide dismutase from Methanobacterium thermoautotrophicum", Protein Data Bank Entry 1MA1, accessed from the Internet on Aug. 9, 2014, www.rcsb.org/pdb/explore/explore.do?structureId=1ma1.

Alber et al., "Kinetic and Spectroscopic Characterization of the Gamma-Carbonic Anhydrase from the Methanoarchaeon Methanosarcina thermophile" Biochemistry (1999)38:13119-13128.

Allert et al., "Computational design of receptors for an organophosphate surrogate of the nerve agent soman" Proc Natl Acad Sci USA (2004)101:7907-7912.

Asada et al., "Crystal structure of inosine-5'-monophosphate dehydrogenase from Pyrococcus horikoshii OT3", Protein Data Bank Entry 2CU0, accessed from the Internet on Aug. 10, 2014, www.rcsb.org/pdb/explore/explore.do?structureId=2cu0.

Ashwell et al., Uronic Acid Metabolism in Bacteria I. Purification and Properties of Uronic Acid Isomerase in *Escherichia coli* J Biol Chem (1960)235:1559-1565.

Barat et al., "Metabolic biotinylation of recombinant antibody by biotin ligase retained in the endoplasmic reticulum" Biomol Eng (2007)24:283-291.

Biteau et al., "ATP-dependent reduction of cysteine-sulfinic acid by S. cerevisiae sulphlredoxin" Nature (2003)425:980-984.

Carvalho-Alves et al., "Stoichiometric Photolabeling of Two Distinct Low and High Affinity nucleotide Sites in Sarcoplasmic Reticulum ATPase" J Biol Chem (1985) 260:4282-4287.

Chapman-Smith et al., "Molecular Biology of biotin attachment to proteins" J Nutr (1999)129:477S-484S.

Collins et al., "Crystals structure of a heptameric Sm-like protein complex from archea: Implications for the structure and evolution of snRNPs" J Mol Biol (2001) 309:915-923.

Cornell et al., "A Second Generation Force Field for the Simulation of Proteins, Nucleic Acids, and Organic Molecules" J Am Chem Soc (1995) 117:5179-5197.

Das et al., "Macromolecular Modeling with Rosetta" Annu Rev Biochem (2008) 77:363-382.

Ebihara et al., "Structure-based functional identification of a novel heme-binding protein from Thermus thermophilus HBB" J Struct Funct Genom (2005) 6:21-32.

Ermolova et al., "Site-Directed Alkylation of Cysteine Replacements in the Lactose Permease of *Escherichia coli*: Helices I, II, VI, and XI" Biochemistry (2006) 45:4182-4189.

Faust et al., "Synthesis of a Protein-reactive ATP analog and Its Application for the Affinity Labeling of Rabbit-Muscle Actin" Eur J Biochem (1974) 43:273-279.

Finzel et al., "Molecular Modeling with Substructure Libraries Derived from Known Protein Structures" in Crystallographic and Modeling Methods in Molecular Design (S Ealick & C Bugg eds.) Springer Verlag, New York (1990) pp. 175-189.

Ge et al., "Enzyme-Based CO2 Capture for Advanced Life Support" Life Support & Biosphere Science (2002) 8:181-189.

Green NM "A Spectrophotometric Assay for Avidin and Biotin Based on Binding of Dyes by Avidin" Biochem. J (1965) 94:23c-24c.

Guex N "Swiss-PdbViewer: A new fast and easy to use PDB viewer for the Macintosh" Experientia (1996) 52:A26.

Guex et al., "Protein Modelling for All" Trends Biochem Sci (1999) 24:364-367.

Hernandez et al., "Dynamic Protein Complexes: Insights from Mass Spectrometry" J Biol Chem (2001) 276:46685-46688.

Holmberg et al., "The biotin-streptavidin interaction can be reversibly broken using water at elevated temperatures" Electrophoresis (2005) 26:501-10.

Horlick et al., "Permuteins of interleukin 1β: A simplified approach for the construction of permuted proteins having new termini" Prot Eng (1992) 5:427-431.

(56) References Cited

OTHER PUBLICATIONS

Horovitz et al., "An accurate method for determination of receptor-ligand and enzyme-inhibitor dissociation constants from displacement curves" Proc Natl Acad Sci USA (1987) 84:6654-6658.
Jacobson et al., "ATP binding to a protease-resistant core of actin" Proc Nat Acad Sci (1976) 73:2742-2746.
Jaenicke R "Stability and folding of ultrastable proteins: eye lens crystallins and enzymes from thermophiles" FASEB J (1996) 10:84-92.
Jeyakanthan et al., "Observation of a calcium-binding site in the gamma-class carbonic anhydrase from Pyrococcus horikoshii" Acta Cryst D (2008)64:1012-1019 (pdb code: 1v3w).
Kay et al., "High Throughput Biotinylation of Proteins" Meth Mol Biol (2009)498:185-198.
Khalifah RG "Carbon dioxide hydration activity of carbonic anhydrase. I. Stop-flow kinetic studies on the native human isoenzymes B and C" J Biol Chem (1971) 246:2561-2573.
Kirk et al., "Optimising the recovery of recombinant thermostable proteins expressed in mesophilic hosts" J Biotechnol (1995) 42:177-84.
Krishnaswamy et al., "Free energies of protein-protein association determined by electrospray ionization mass spectrometry correlate accurately with values obtained by solution methods" Protein Sci (2006) 15:1465-1475.
Kumar et al., "Factors enhancing protein thermostability" Prot Eng (2000) 13:179-191.
Kurzban et al., "The Quaternary Structure of Streptavidin in Urea" J Biol Chem (1991) 266:14470-14477.
Lepock et al., "Contribution of Conformational Stability and Reversibility of Unfolding to the Increased Thermostability of Human and Bovine Superoxide Dismutase Mutated at Free Cysteines" J Biol Chem (1990) 265:21612-21618.
Maren TH, "A simplified micromethod for the determination of carbonic anhydrase and its inhibitors" J Pharmacol Exp Ther (1960) 130:26-29.
Matulis et al., "Thermodynamic Stability of Carbonic Anhydrase: Measurements of Binding Affinity and Stoichiometry Using ThermoFluor" Biochemistry (2005) 44:5258-66.
Merrifield RB "Solid Phase peptide Synthesis. I. The Synthesis of a Tetrapeptide" J Am Chem Soc (1963) 85:2149-2154.
Mohan et al., "Continuum model calculations of solvation energies: Accurate evaluation of electrostatic contributions" J Phys Chem (1992) 96:6428-36.
Mohan et al., "Docking: Successes and Challenges" Curr Pharmaceutical Design (2005) 11:323-333.
Neves-Peterse et al., "Photonic activation of disulfide bridges achieves oriented protein immobilization on biosensor surfaces" Prot Sci (2006) 15:343-351.
Pantazatos et al., "Rapid refinement of crystallographic protein construct definition employing enhanced hydrogen/deuterium exchange MS" Proc Natl Acad Sci USA (2004) 101:751-756.
Potier et al., "Using nondenaturing mass spectrometry to detect fortuitous ligands in orphan nuclear receptors" Protein Sci (2003) 12:725-733.
Repo et al., "Binding properties of HABA-type azo derivatives to avidin and avidin-related protein 4" Chem Biol (2006) 13:1029-1039.
Riddles et al., "Reassessment of Ellman's Reagent" Meth Enzymol (1983) 91:49-60.
Salemme FR "Cooperative motion and hydrogen exchange stability in protein β-sheets", Nature (1982) 299:754-756.
Sano et al., "Cooperative Biotin Binding by Streptavidin Electrophoretic Behavior and Subunit Association of Streptavidin in the Presence of 6M Urea" J Biol Chem (1990) 265:3369-3373.
Sano et al., "Expression of a cloned streptavidin gene in *Escherichia coli*" Proc Natl Acad Sci USA (1990) 87:142-146.
Sano et al., "Recombinant Core Streptavidins A Minimum-sized Core Streptavidin has Enhanced Structural Stability and Higher Accessibility to Biotinylated Macromolecules" J Biol Chem (1995) 270:28204-28209.

Sasaki et al., "Two-dimensional arrangement of a functional protein by cysteine-gold interaction: enzyme activity and characterization of a protein monolayer on a gold substrate" Biophysical Journal (1997) 72:1842-1848.
Shimkus et al., "A chemically cleavable biotinylated nucleotide: Usefulness in the recovery of protein-DNA complexes from avidin affinity columns" Proc Natl Acad Sci USA (1985) 82:2593-2597.
Sorensen et al., "Production of recombinant thermostable proteins expressed in *Escherichia coli*: completion of protein synthesis is the bottleneck" J Chromatogr B Analyt Technol Biomed Life Sci (2003) 786:207-214.
Spraggon et al., "On the use of DXMS to produce more crystallizable proteins: Structures of the T. maritima proteins TM0160 and TM1171" Prot Sci (2004) 13:3187-3199.
Spura et al., "Biotinylation of Substituted Cysteines in the Nicotinic Acetylcholine Receptor Reveals Distinct Binding Modes for a-Bungarotoxin and Erabutoxin" J Biol Chem (2000) 275:22452-22460.
Suter "Isolation and Characterization of Highly Purified Streptavidin Obtained in a Two-Step Purification Procedure from Streptomyces avidinii Grown in a Synthetic Medium" J Immunol Meth (1988) 113:83-91.
Taremi et al., "Construction and Expression of a Novel Fully Activated Recombinant Single-chain Hepatitis C Virus Protease" Prot Sci (1998) 7:2143-2149.
Thompson LD, Weber PC "Expression of Streptavidin from a Synthetic Gene" Gene (1993)136:243-6.
Waner et al., "Thermal and Sodium Dodecylsulfate Induced Transitions of Streptavidin" Biophys J (2004) 87:2701-2713.
Wasserman et al., "A Molecular Dynamics Investigation of the Elastomeric Restoring Force in Elastin" Biopolymers (1990) 29:1613-1631.
Wendoloski et al., "Molecular Dynamics Simulation of a Phospholipid Micelle" Science (1989) 243:636-638.
Wendoloski et al., "PROBIT: A Statistical Approach to Modeling Proteins from Partial Coordinate Data Using Substructure Libraries" J Mol Graphics (1992)10:124-126.
Woo et al., Reversing the inactivation of peroxlredoxins caused by cysteine sulfinic acid formation Science (2003) 300:653-658.
Wu et al., "Engineering Soluble Monomeric Streptavidin with Reversible Biotin Binding Capability" J Biol Chem (2005) 280:23225-23231.
Wu et al., "Binding of ATP to brain glutamate decarboxylase as studied by affinity chromatography" J Neurochem (1984) 42:1607-1612.
Yamashita et al., "Type 2 isopentenyl diphosphate isomerase from a thermoacidophilic archaeon Sulfolobus Shibatae" Eur J Biochem (2004) 271:1087-1093.
Yu et al., "Crystal structures of catalytic complexes of the Fe(II)-oxoglutarate-dependent DNA repair enzyme AlkB give insight into promiscuous substrate recognition and oxidation chemistry" Nature (2006) 439:879-884.
Zhang et al., "Determination of amide hydrogen exchange by mass spectrometry: a new tool for protein structure elucidation" Prot Sci (1993) 2:522-531.
Zimmerman et al., "Characterization of CamH from Methanosarcina thermophila, founding member of a subclass of the gamma class of carbonic anhydrases" J Bacteriol (2010) 192:1353-1360.
Zofall et al., "Two novel dATP analogs for DNA photoaffinity labeling" Nuc Acids Res (2000) 28:4382-4390.
Cloutier et al., "Streptabody, a highly avidity molecule made by tetramerization of in vivo biotinylated, a phage display-selected scFv fragments on streptavidin," Molecular Immunology 37: 1067-1077 (2000).
Drexler (ed.) et al., "Productive Nanosystems: A Technology Roadmap 2007", Battelle Memorial Institute and Foresight Nanotech Institute, 2007.
Peel et al., "Short Communications : Inactivation by Substrate plus Oxygen of the Pyruvate Dehydrogenase of a Strictly Anaerobic Bacterium", Biochem. J. (1965) 94:21c-22c.
Schaffer et al., "The structure of secondary cell wall polymers: how Gram-positive bacteria stick their cell walls together," Microbiology (2005), 151, 643-651.

(56) References Cited

OTHER PUBLICATIONS

Filing Receipt in U.S. Appl. No. 13/398,820 dated Mar. 1, 2012.
Office Action issued in U.S. Appl. No. 12/766,658 dated Jan. 4, 2013.
Office Action issued in U.S. Appl. No. 12/766,658 dated Sep. 19, 2013.
Office Action issued in U.S. Appl. No. 12/892,911 dated Sep. 11, 2014.
Notice of Allowance issued in U.S. Appl. No. 12/766,658 dated Mar. 14, 2014.
Notice of Allowance issued in U.S. Appl. No. 12/766,658 dated Jul. 31, 2014.
Notice of Allowance issued in U.S. Appl. No. 12/766,658 dated Nov. 6, 2014.
Notice of Allowance issued in U.S. Appl. No. 12/766,658 dated Dec. 19, 2014.
Restriction Requirement in U.S. Appl. No. 12/892,911 dated Apr. 3, 2014.
Restriction Requirement in U.S. Appl. No. 13/797,283 dated May 15, 2014.
Restriction Requirement in U.S. Appl. No. 13/797,283 dated Oct. 16, 2014.
Examiner-Initiated Interview Summary issued in U.S. Appl. No. 12/766,658 dated Mar. 14, 2014.
Examiner-Initiated Interview Summary issued in U.S. Appl. No. 12/766,658 dated Mar. 6, 2014.
Applicant-Initiated Interview Summary issued in U.S. Appl. No. 12/766,658 dated Jun. 6, 2013.
Advisory Action issued in U.S. Appl. No. 12/766,658 dated Mar. 6, 2014.
Zaks et al., "Enzymatic catalysis in nonaqueous solvents" J Biol Chem (1988)263:3194-3201.

\* cited by examiner

METHOD OF PROTEIN NANOSTRUCTURE FABRICATION

This application is a National Stage of International Application No. PCT/US2010/34248, filed May 10, 2010, which claims the benefit of U.S. Provisional Application No. 61/177,256, filed May 11, 2009.

This application hereby incorporates the specifications of U.S. Provisional Application No. 60/996,089, filed Oct. 26, 2007, International Application No. PCT/US2008/012174, filed Oct. 27, 2008 (published as international publication WO2009/055068 on Apr. 30, 2009), U.S. Provisional Application No. 61/173,114, filed Apr. 27, 2009, U.S. Nonprovisional application Ser. No. 12/766,658, filed Apr. 23, 2010, U.S. Provisional Application No. 61/136,097, filed Aug. 12, 2008, U.S. Provisional Application No. 61/173,198, filed Apr. 27, 2009, U.S. Nonprovisional application Ser. No. 12/589,529, filed Apr. 27, 2009, International Application No. PCT/US2009/053628, filed Aug. 13, 2009 (published as international publication WO2010/019725 on Feb. 18, 2010), U.S. Provisional Application No. 61/246,699, filed Sep. 29, 2009, and U.S. Provisional Application No. 61/177,256, filed May 11, 2009 in their entirety by reference. All documents cited herein or cited in any one of the specifications incorporated by reference are hereby incorporated by reference.

This invention was made with government support under grant numbers 1 R43 GM080805-01A1 and 1 R43 GM077743-01A1 awarded by the National Institutes of Health. The government has certain rights in the invention.

SUMMARY OF THE INVENTION

A method according to the invention of assembling a protein nanostructure on a surface can include selectively patterning a surface with at least one fixation site, bringing at least one protein node into contact with the surface, and allowing the at least one protein node to bond with the fixation site, so that the position and/or orientation of the at least one protein node is constrained. The protein node can include an interaction domain. The interaction domain of a first protein node can interact with the interaction domain of a second protein node, so that the position and/or orientation of the first protein node with respect to the position and/or orientation of the second protein node is constrained. The protein node can rotate about an axis normal to the surface. The protein node can be a substantially C3-symmetric, substantially C4-symmetric, or substantially C6-symmetric protein node. The protein node can include a plurality of subunits. The plurality of protein nodes can be bonded to fixation sites to form an extended structure on the surface. The plurality of protein nodes can be bonded to fixation sites to form a repeating structure or tessellation on the surface. The interaction domains of two or more protein nodes can interact to lock the protein nodes into a final desired orientation on the surface. The at least one protein node can be linked to a streptavidin protein. Two protein nodes can be linked to each other through a streptavidin protein. The surface can include a solid surface. The surface can include silicon, silicon oxide, carbon, graphene, and/or a semiconductor. The fixation site can include an atom or a cluster of atoms. The atom or cluster of atoms can be selected from the group consisting of metal, a noble metal, and gold, which can be deposited onto the surface. A terminal cysteine group on the at least one protein node can bond with the fixation site. The surface can be selectively patterned with the fixation site by depositing a metal, noble metal, or gold atom or cluster of atoms onto the surface with an atomic force microscope tip. The interaction domain of the first protein node and the interaction domain of the second protein node can interact through an electrostatic, a hydrogen bonding, a hydrophobic, and/or a van der Waals interaction. The strength of the interaction between the interaction domain of the first protein node and the interaction domain of the second protein node can dependent on an external condition. The external condition can include pH, temperature, chemical species concentration, light and/or other radiation exposure, electric field, magnetic field, and/or another external condition.

In an embodiment according to the invention, a protein nanostructure can include a protein node and a selectively patterned surface having at least one fixation site, the protein node bonded with the at least one fixation site, or a binding domain comprising a sequence of amino acid residues, the protein node comprising a plurality of subunits, the subunits covalently linked through a sequence of amino acid residues, and the binding domain covalently linked to a subunit. The protein nanostructure can include a selectively patterned surface having at least one fixation site and a protein node bonded with the at least one fixation site. The protein node can be bonded with the at least one fixation site through a covalent, van der Waals, and/or thiol-gold bond. The protein nanostructure can include a first antibody protein. The protein node can include a first protein binding domain and the first antibody protein can be bound to the first protein binding domain. The protein nanostructure can include a streptavidin bound to an adaptor protein having a second protein binding domain and a second antibody protein different from the first antibody protein. The second antibody protein can be bound to the second protein binding domain. The streptavidin can be bound to the protein node. A biosensor can include the protein nanostructure.

A kit according to the invention can includea selectively patterned solid surface having at least one fixation site and a protein node. The protein node can bond with the at least one fixation site.

In an embodiment according to the present invention, a first binding domain can be covalently linked to the subunit of the protein node to form a binding domain node, and the first binding domain can bind an Ig (immunoglobulin) or antibody. For example, the first binding domain can be a Protein G domain and/or bind an IgG (immunoglobulin G). A streptavidin can be bound to an adaptor protein having a second binding domain that can bind a second immunoglobulin. The streptavidin can be bound to the binding domain node. The second binding domain can bind a second immunoglobulin that is different from the first immunoglobulin that the first binding domain binds.

In a method according to the present invention, a streptavidin or streptavidin derivative can be reacted with a thiol-reactive azido-ATP reagent to form an azido-ATP modified streptavidin. An Ig (immunoglobulin) and a dimeric ATP-binding protein incorporating fused binding domains can be allowed to interact to form a first complex. The first complex can be photocrosslinked with the azido-ATP modified streptavidin to form a second complex. The second complex can be allowed to bind with a single chain protein node having a fused binding domain and a bound Ig.

In this text, including the claims, a reference to one item is to be understood as encompassing a reference to two or more items.

DETAILED DESCRIPTION

The ability to control the structural and functional properties of materials at the nanoscale can enable technologies in areas such as energy, water purification, semiconductor device fabrication, and medical devices. A common underlying approach, embodied in a scalable architectural platform, can allow the fabrication of materials and devices with features at the nanoscale using a uniform assembly strategy and enable the broad applicability of nanotechnology.

A flexible and scalable technology platform for nanotechnology can use a combination of top-down and bottom-up self-assembly methods. Engineered proteins, polymers that are able to spontaneously self-assemble to organize thousands of atoms with atomic precision, can play a role in the platform. A flexible set of architectural components can be assembled into an essentially infinite set of engineered nanostructures with one, two, and three-dimensional organization.

In an embodiment, nanostructures can be assembled with proteins. The protein nanostructures can themselves be the basis for functional biomaterials. In another embodiment, the organized structures formed of the protein materials can essentially serve as a resist or template, enabling the patterning of other materials. Hybrid structures can incorporate nanostructures using a combination of these methods, for example, (1) using the protein nanostructures themselves as the basis for functional biomaterials, and (2) using organized structures formed of protein materials as a resist or template for the patterning of other materials (see, FIG. 1).

Figure 1:
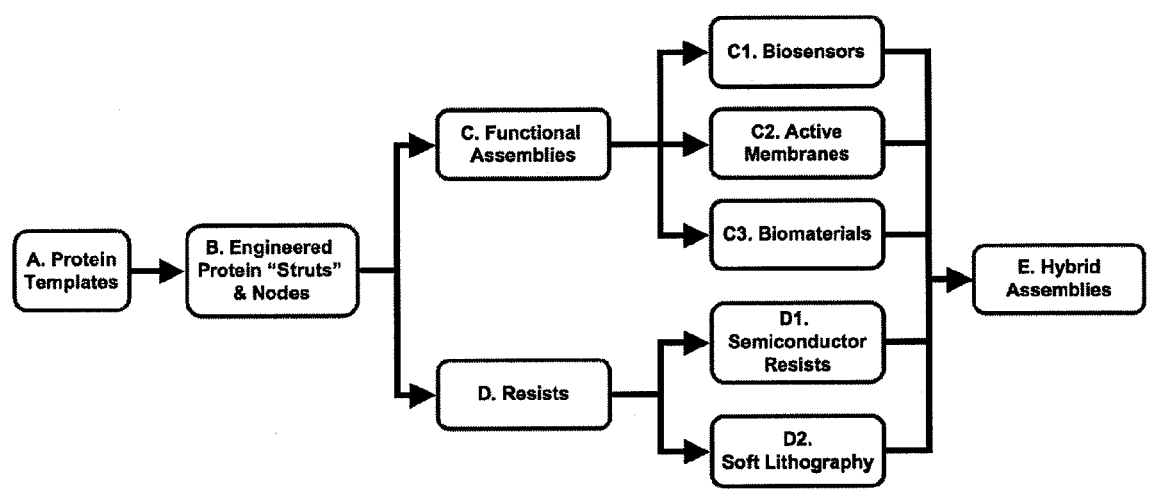
FIG. 1 illustrates a scheme for a scalable architecture for nanotechnology.
Figure 5:
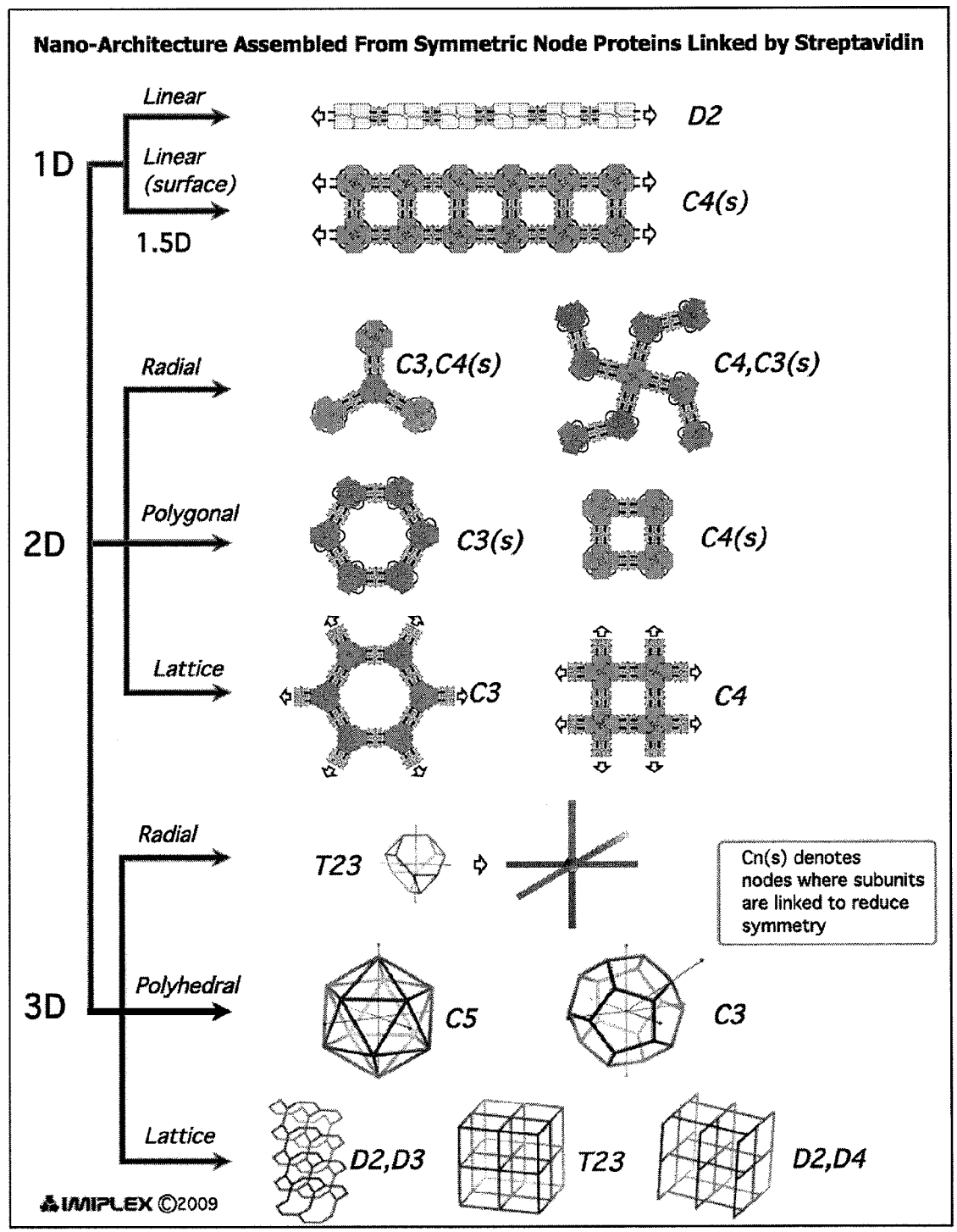
FIG. 5 illustrates a hierarchy of protein-based nanostructure architecture.

FIG. 1 illustrates that known and to be determined 3-dimensional (3D) structures of thermostable proteins (A) and methods of protein engineering (computer modeling, site specific modification, recombinant DNA technology, protein expression, etc.) can be used as a basis for creating a flexible set of nanoscale components (B) that can be assembled into 1, 2, and 3-dimensional structures (e.g., see, FIG. 5). The assembled nanostructures can have, for example, two different types of applications. For example, a first set of assembly applications (C) can be functional assemblies, where the underlying protein architecture has been modified, e.g., through the attachment of immunoglobulins, binding molecules, growth factors, reporter enzymes, adhesion molecules, etc., so that the protein architecture forms a functional biological interface. Applications include, e.g., biosensors for pathogen and/or disease marker diagnosis, active membranes for water purification and filtration, and substrate materials for biomaterials such as artificial skin, cartilage, and bone. A second set of assembly applications (D) involves using the protein-based nanoarchitecture as a resist or patterning agent that can be used to pattern semiconductor materials or be coated with metal. The protein nanoarchitecture can be used for initial patterning, but can be subsequently physically removed from the assembly by etching or heating. The patterns developed from using the protein nanoarchitecture as a resist or pattern can be used as a step in a semiconductor fabrication process or to generate stamps using soft lithography processes. Fabrication methods may used together to produce hybrid structures (E), where, e.g., substrate nanostructures are produced using soft lithography and coated with functional protein nano-architectures.

A nanometer is $1 \times 10^{-9}$ meters, roughly equivalent to the length of a carbon atom chain nine atoms long, and substantially less that the wavelength of visible light (~400 nM). There are a number of advantages to being able to control assembly architecture at the nanoscale. Examples of such advantages can include the following:

Miniaturization: The efficiency of electronic or memory devices ultimately devolves on maximizing the density with which discrete components can be manufactured on an appropriate substrate. Silicon-based semiconductor fabrication technology has continuously progressed over the last 40 years according to Moore's Law, with an approximate doubling in device density every two years. As a result, processes are now in place or under development that will produce integrated circuits with 45 nm features. Although there have been many (incorrect) predictions made in recent years that practical limits to device miniaturization had been reached, pushing device densities beyond the latest generation may be subject to fundamental physical limitations (International Technology Roadmap for Semiconductors (http://www.itrs.net/reports.html)).

Emergence of New Properties: The emergence of new properties in very small systems can be exploited for development of new kinds of functional devices. Examples of such new properties include, for example, effects that stem from statistical or quantum characteristics that emerge in very small systems and novel physical characteristics that emerge through the interaction of light with structures having sub-optical wavelength dimensions.

Biological System Interfaces: Materials and/or devices can directly interact with biological systems and/or directly incorporate biological macromolecules as intrinsic structural or functional components. Functionality and interaction specificity of biological systems is manifest in the structure of macromolecules structurally organized at the nanoscale, principally proteins and nucleic acids, which in a sense are respectively specialized for structure-function and information storage and processing roles. Most proteins organized as folded polymers of amino acids have subunit structures that self-organize thousands of atoms with atomic precision over ranges of 1 to 100 nm, and manifest a wide range of structural, catalytic, binding, and signal transducing properties. Many proteins can intrinsically, or be engineered to bind to surfaces with a defined orientation, a characteristic that can be important in processes such as active filtration, directional transport of chemical substances, or charge storage on surfaces. Rich functionally of proteins can physically arise from near equivalence of several different types of interaction forces (e.g., electrostatic, van der Waals interaction, and solvation effects) and the corresponding effects of statistical energy fluctuations on the order of a few kT that dominate the behavior of biological systems on the molecular scale (Phillips & Quake, 2006).

Scalability: Scalability can enable the broad application of a manufacturing technology. In the context of engineered nanostructures, scalability can have, for example, two different aspects. A first aspect involves the ability to manufacture structures using a parallel manufacturing process. For example, early conceptions of nanostructure fabrication—motivated by studies demonstrating the ability to manipulate single atoms using atomic force microscopy—envisioned that devices could be assembled essentially atom by atom using molecular scale atomic manipulators (Drexler, 1992). However, this may be an impractical process for assembling many devices owing to the time required to perform what is intrinsically a serial process that would have to repeated many thousands (if not millions) of times per individual nanostructure. As outlined below, the combination of a top-down approach, able to specify the position of a few nucleation sites, coupled with a self-assembly process around each of the nuclei, can produce highly engineered nanostructures in a parallel production mode.

A second aspect of scalability applies to the use of nanostructures for intrinsically large-scale applications like water purification which may require active membrane structures that are, on the one hand, organized on the nanostructural level, but on the other, manufactured as membrane assemblies on very large scale to have useful capacity. Additional applications that can lead to very large-scale assemblies include energy storage devices or photovoltaic cells. Engineered proteins can ultimately be produced in plants for a few dollars a pound. (http://www.sciencedaily.com/releases/1999/07/990715134504.htm).

An engineered streptavidin adaptor based on a protein, can, for example, act as a controllable component adaptor for linking streptavidin strut structures. For example, an engineered streptavidin adaptor can act as a reversible protecting group for pairs of streptavidin binding sites, and provide precise control over nanostructure assembly. Nanostructures can incorporate components such as engineered streptavidin adaptors (also termed streptavidin macromolecular adaptors (SAMAs)) and protein nodes. SAMAs, structures constructed from SAMAs and/or streptavidin tetramers, ways of making SAMAs and structures incorporating SAMAs, and ways of using SAMAs and structures incorporating SAMAs are described in the international publication number WO2009/055068 (published Apr. 30, 2009, publication of international application number PCT/US2008/012174, filed Oct. 27, 2008), which is hereby incorporated by reference in its entirety.

A protein node can be a protein that serves as a connector. A protein node can have one or more attachment points with defined, for example, nonlinear, geometry. Nodes can be linked together, for example, with streptavidin struts, to establish the topology of a structure. For example, a protein node can be based on a protein that has multiple subunits arranged symmetrically. Protein nodes, structures constructed using nodes, ways of making nodes and structures incorporating nodes, and ways of using nodes and structures incorporating nodes are described in the international publication number WO2010/019725 (published Feb. 18, 2010, publication of international application number PCT/US2009/053628, filed Aug. 13, 2009), which is hereby incorporated by reference in its entirety.

A fixation site can, for example, be a location on a surface that constrains the position and/or orientation of a protein node that is linked or bonded to the fixation site. That is, a fixation site can be a point of immobilization for a protein node. For example, a protein node bonded to a fixation site may be able to rotate, but not to translate relative to the surface. Alternatively, a protein node may be bonded to a fixation site, so that it can neither rotate nor translate relative to the surface. Two (or more) protein nodes that are bonded to fixation sites that are able to rotate, but not translate, with respect to the surface may also have interaction domains. The interaction domains of the two (or more) protein nodes may interact to further constrain the motion of the protein nodes, for example, to constrain the rotation as well as the translation of the protein nodes relative each other and/or to the surface. For example, the interaction domain of a first protein node and the interaction domain of a second protein node can interact through electrostatic, hydrogen bonding, hydrophobic, and/or van der Waals interactions.

Figure 2:
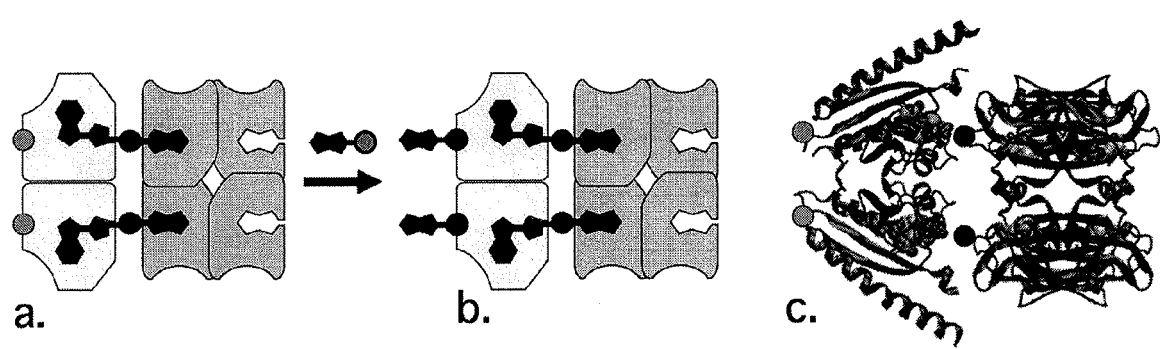
FIG. 2 illustrates an engineered streptavidin adaptor.

For example, FIG. 2 illustrates an engineered streptavidin adaptor. Part a. schematically shows a streptavidin tetramer that has two biotin binding sites free and two sites occupied by biotin groups attached to biotin-azido-ATP (adenosine triphosphate) cross-link molecules that link streptavidin to a dimeric ATP binding protein (e.g., a SAMA). The pair of dots at the extreme left of the structure shown in part a. indicate cysteine sites that can be biotinylated. Part b. shows a schematic of the biotinylated complex, which "regenerates" streptavidin binding activity and gives the effect of a "reversible" protecting group for two of the four biotin binding sites on streptavidin. Incorporation of these adaptors into strut assemblies, for example, streptavidin strut assemblies, allows the controlled assembly of streptavidin linked nanostructures. Part c. shows streptavidin docked with the thermostable, dimeric ATP binding protein MJ0577 (pdb code: 1MJH) that can be used as a reversible protecting group (e.g., a SAMA) for streptavidin for nanostructure assembly applications. Adaptor proteins (e.g., SAMAs) can also be engineered to incorporate functional domains like immunoglobulin binding domains useful in biosensors (see, FIG. 7).

Figure 3:
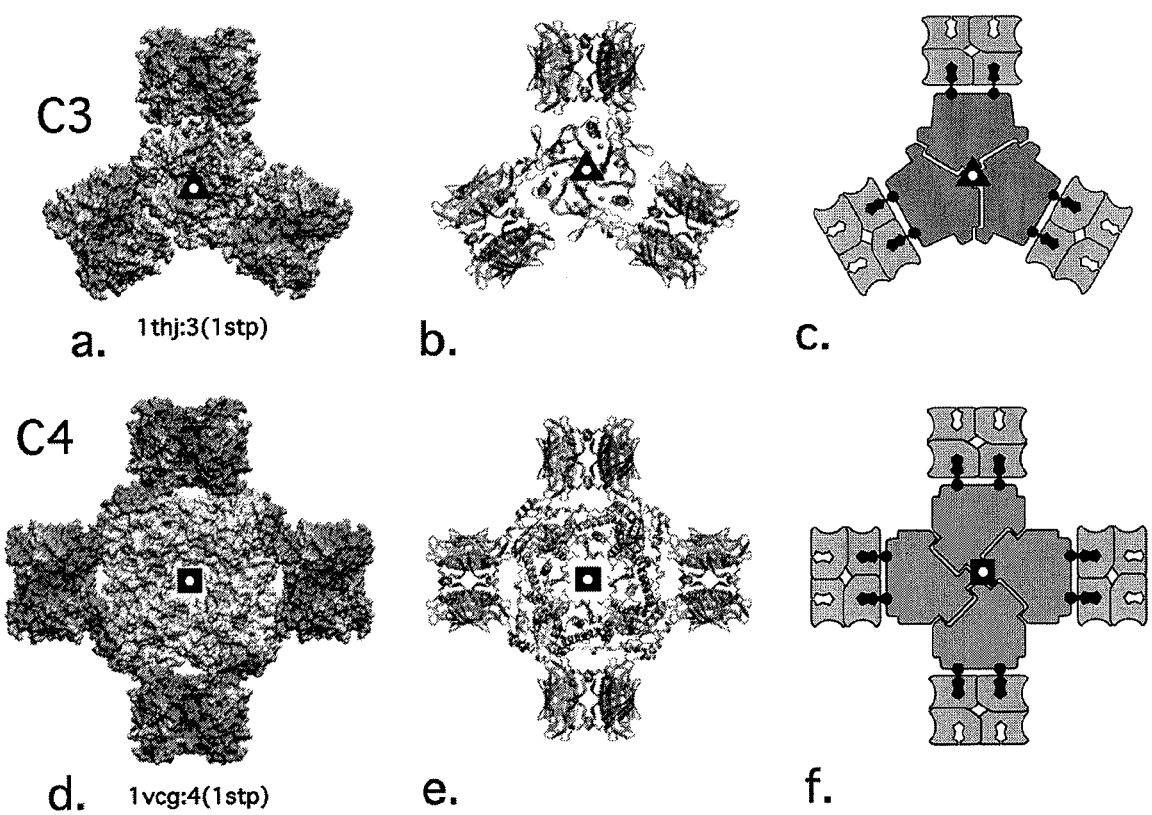
FIG. 3 illustrates C3 and C4-symmetric nodes and streptavidin complexes.

FIG. 3 illustrates C3 and C4-symmetric nodes and streptavidin complexes. The top row of images (parts a., b., and c.) shows C3-symmetric node:streptavidin complexes in space filling molecular representation (a.), polypeptide backbone ribbon representation (b.), and schematic representation (c.). The carbonic anhydrase from the thermophilic microorganism *Methanosarcina thermophila* (pdb code 1thj) can be used as a template for the C3 node. The bottom row of images (parts d., e., and f.) shows corresponding C4-symmetric node:streptavidin complexes. The C4 template node protein shown is the IPP isomerase from the thermophilic microorganism *Thermus thermophilus* (pdb code 1vcg). 1stp is the Protein Data Bank (pdb) code for streptavidin. Nodes can also be, for example, C6-symmetric protein nodes. For example, two or more protein nodes can be linked to each other through a streptavidin protein.

Figure 4:
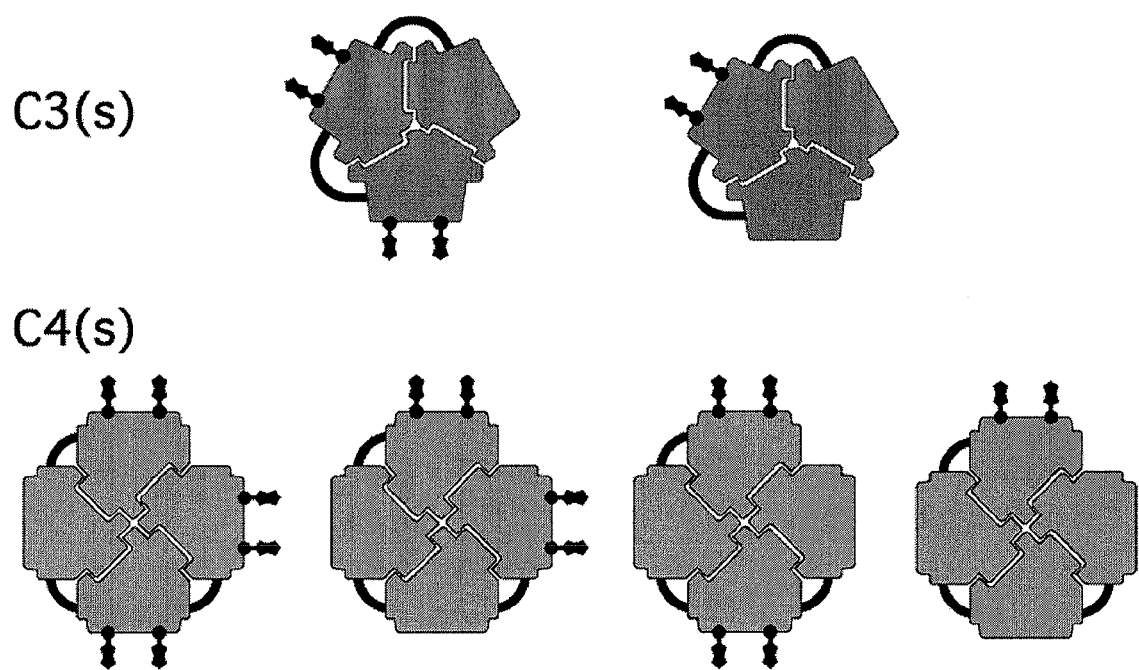
FIG. 4 illustrates single chain C3 and C4-symmetric nodes with reduced ligation.

FIG. 4 illustrates single chain C3 and C4-symmetric nodes with reduced ligation. Protein engineering and recombinant DNA methods can be used to connect subunits of symmetric node structures into a single polypeptide chain. This allows a reduction in the number of biotinylation sites in a structure, resulting in an expanded set of node structures with defined geometry and ligation number for attached streptavidin struts. The top row of FIG. 4 shows C3 symmetric single-chain structures, including a 120 degree divalent node connector and a monovalent cap. The bottom row shows various possibilities for C4 single-chain ligation number and geometry. These constructs can be, for example, based on the template proteins shown in FIG. 3.

FIG. 5 illustrates a hierarchy of protein-based nanostructure architecture. Nature affords a large number of thermostable multimeric proteins potentially useful for 1D, 2D, and 3-dimensional nanostructure assemblies. These include both infinite (lattice) and finite structures. Some of these structures are shown in FIG. 5.

Figure 6:
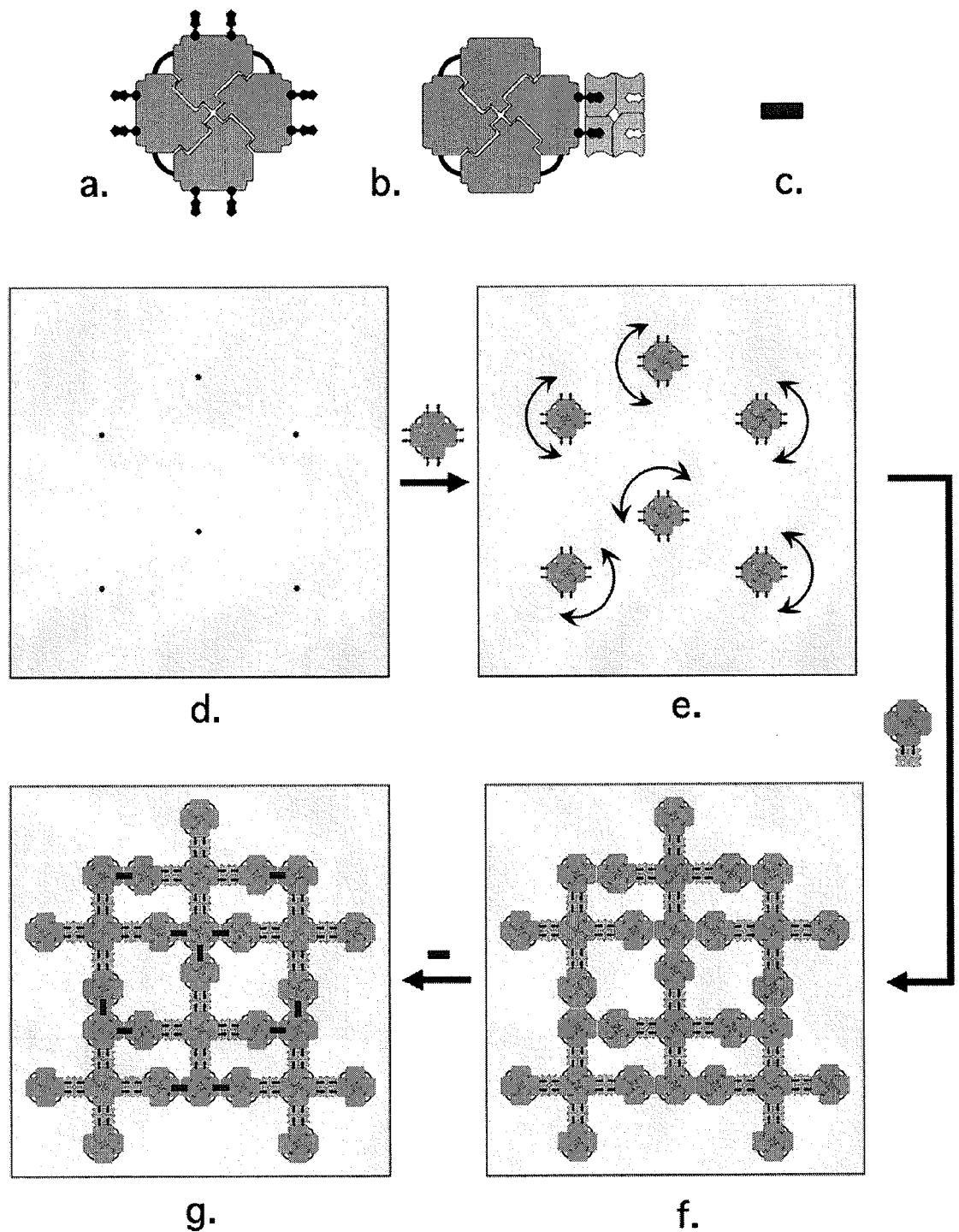
FIG. 6 illustrates an example of the assembly of nanostructures using a combination of top-down and bottom-up approaches.

FIG. 6 illustrates an example of the assembly of nanostructures using a combination of top-down and bottom-up approaches. Part a. shows a C4-symmetric node with polypeptide termini enabling it to chemically bind to a substrate surface; e.g., through reaction of orienting cysteine thiol groups, for example, a terminal cysteine group, on the protein polypeptide chain with gold atoms on a substrate surface. Part b. shows a 1:1 complex of streptavidin with a C4-single-chain capping group. The single-chain capping group subunits can form geometrically defined interactions with subunits of other C4-single-chain capping groups (interactions shown schematically in Part c.). Part d. shows a surface, e.g., a substrate material, that has been selectively or precision patterned with a few fixation sites, for example, chemically reactive sites, such as an atom or one or more small clusters of gold atoms, noble metal atoms, metal atoms, or other atoms positioned using atomic force microscopy, for example, with an atomic force microscope tip, or other methods. For example, the surface can include a solid surface. For example, the surface can include a semiconductor, silicon, silicon oxide, carbon, and/or graphene. Part e. shows these sites as fixation points, or points of immobilization, for example, that constrain the position and/or orientation of biotin-functionalized C4 nodes; e.g., through reaction and/or bonding of the gold atoms with terminal cysteine thiol groups on the protein polypeptide chain. Nodes immobilized at this stage can have substantial flexibility in orientation. For example, an immobilized node can rotate about an axis normal to the surface. Part f. shows the result of addition of a streptavidin:C4 single-chain capping node complex to form a finite patterned structure. Part g. shows the structure "fixed" through interactions (small rectangle boxes) formed between the terminal single chain nodes when they are in proper relative orientation and proximity. According to the final pattern of static interactions that are desired in the structure, the terminal groups (e.g., the single-chain C4 node structures in part b.) can be engineered to incorporate interaction domains, for example, chemically reactive or structurally interacting polypeptide domains (small rectangle boxes in part g.) that will "lock" the components into their final desired orientation. For example, the interaction domain of a first protein node and the interaction domain of a second protein node can interact through electrostatic, hydrogen bonding, hydrophobic, and/or van der Waals interactions.

In an embodiment, the strength of an interaction between an interaction domain of a first protein node and an interaction domain of a second protein node can be dependent on an external condition. Examples of such external conditions include pH, temperature, chemical specifies concentration, light or other radiation exposure, an electric field, a magnetic field, and/or another external condition. For example, the strength of an interaction can be characterized by the energy required to achieve separation of the first protein node from the second protein node.

An arbitrarily large number of finite and semi-infinite "tessellated" or repeating structures or extended structures can be created using this approach, where the initial immobilization of only a few atoms, or clusters of atoms, can serve to restrict the organizational degrees of freedom the structure can subsequently assume as it is progressively assembled.

Figure 7:
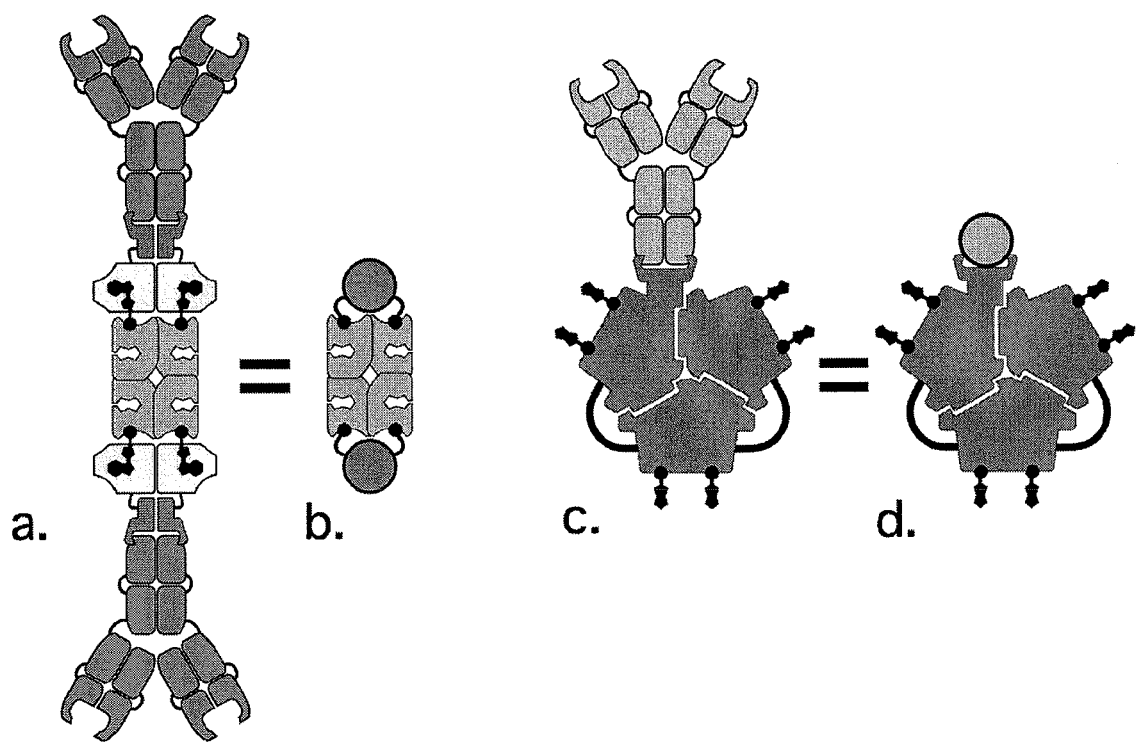
FIG. 7 illustrates functional nanostructure components for sensor and biomedical applications.

FIG. 7 illustrates functional nanostructure components for sensor and biomedical applications. Protein-based nanostructures can be functionalized by incorporation or attachment of prosthetic groups, dyes, or other proteins with binding, sensing, or catalytic function. As an example, part a. diagrammatically shows a site-modified form of streptavidin that is modified to allow chemical reaction with a modified adaptor protein (see FIG. 2) incorporating immunoglobulin (IgG) protein binding domains. Part c. shows a single-chain C3 symmetric node where one chain has been modified to covalently incorporate a polypeptide sequence encoding a different IgG binding domain. Parts b. and d. show schematic representations, because such structures can be engineered, so that the IgG binding domains project from the plane of the underlying architecture, to facilitate simultaneous binding of, e.g., two different IgGs to the same antigen.

Figure 8:
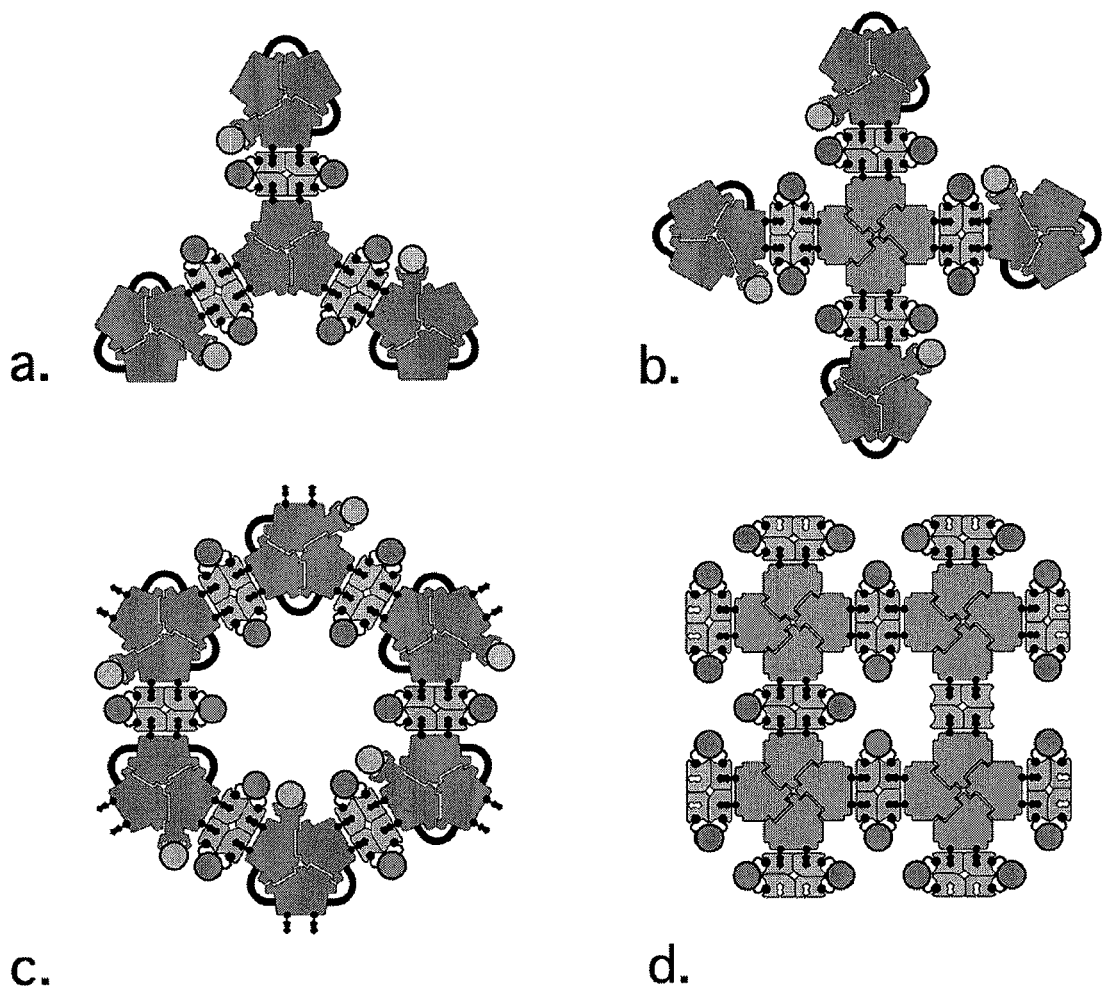
FIG. 8 illustrates examples of biosensor architecture.

FIG. 8 illustrates examples of biosensor architecture. Parts a. through d. show schematic representations (using the representations of FIG. 7) of various nanoarray assemblies built using components shown in FIGS. 3, 4, and 7, and incorporating immobilized antibodies in close proximity. Specifically, the components outlined in FIG. 7 can be used together with other Cn-symmetry nodes to produce a variety of 2D sensor architectures. These can include small arrays like those shown in parts a. and b., or extended lattices (parts c. and d.). Structures like a., b., and c. potentially allow simultaneous attachment of two different antibodies (for example, different antibodies attached to the streptavidin tetramers than are attached to the C3-symmetric nodes) able to simultaneously bind to two different epitopes on an antigen. Interaction with simultaneous, but different binding sites on an antigen can increase affinity and specificity for antigen binding, for example, by several orders of magnitude. In the unbound state, the surface bound IgG molecules can be relatively flexible, but can become relatively immobilized on antigen binding. Immobilization of the antigen can be detected using a number of different biophysical methods including surface plasmon resonance (SPR, Smith & Corn 2003) or fluorescence resonant energy transfer (FRET, Lackowitz 1999) methods.

Figure 9:
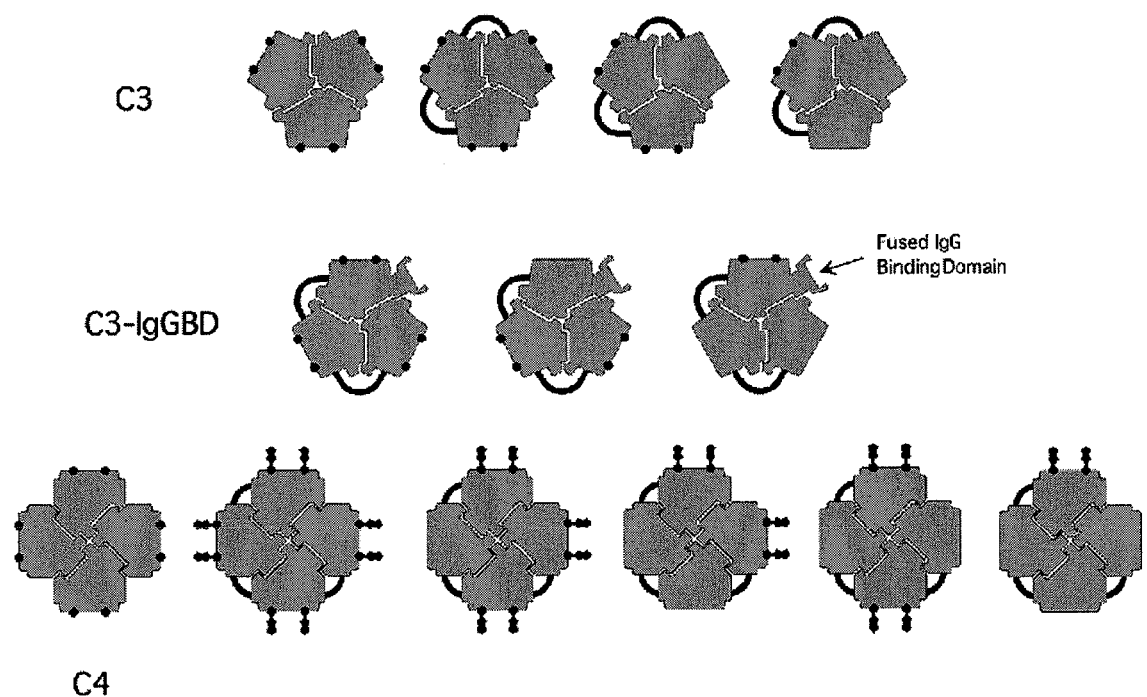
FIG. 9 illustrates protein nodes.
Figure 10:
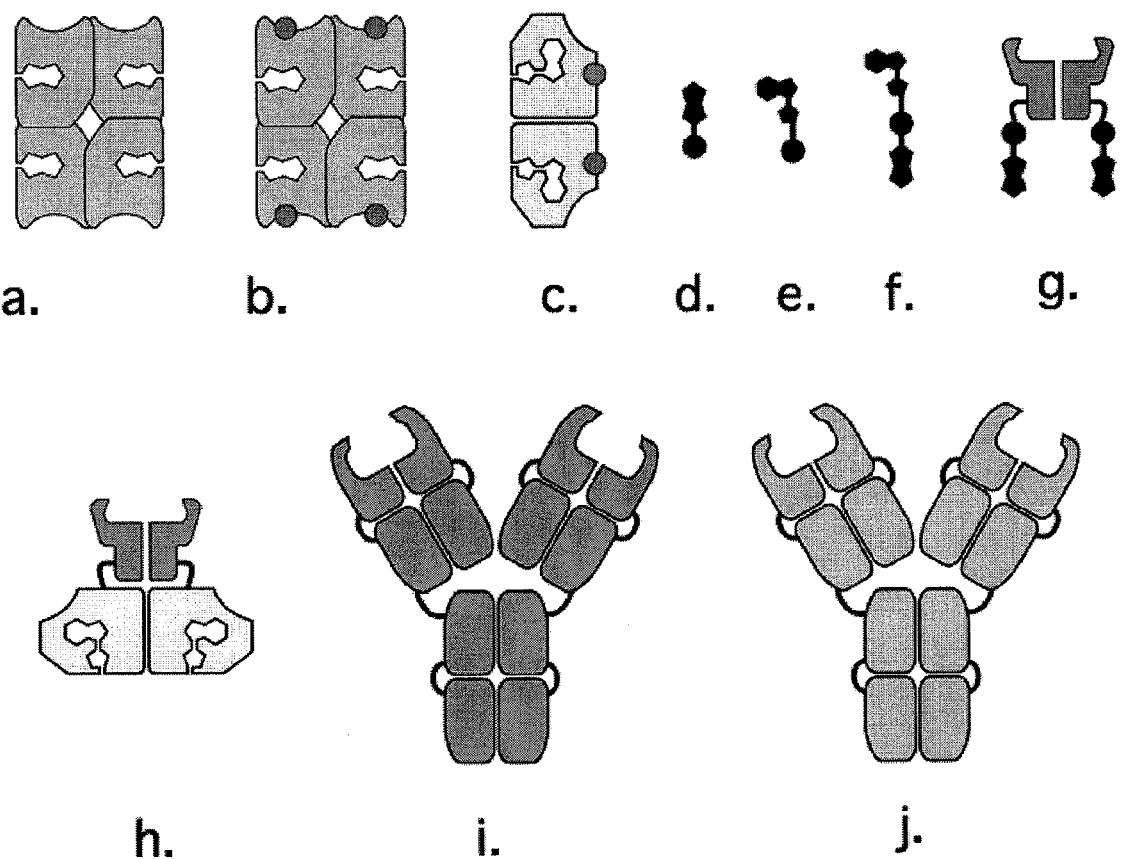
FIG. 10 illustrates reagents and protein components for nanoassembly fabrication.

The components shown in FIGS. 9 and 10 embody, for example, three types of functions: 1) node components with different strut-binding geometry and ligation number that control nanostructure architectural features, 2) strut components that interconnect the nodes, and 3) reagents and engineered adaptor proteins that facilitate controlled assembly of the nanostructures or the attachment of additional proteins that can confer functionality on the underlying nanostructure architecture. Multiple functions can be combined in a single molecular component, as, for example, in the single-chain C3 nodes incorporating the integrally fused IgG binding domain (FIG. 9. center row). For example, the binding domain can be a Protein G domain. Different approaches can be used to control nanostructure assembly. A first approach involves a thiol-reactive iminobiotin reagent. Since iminobiotin binding to streptavidin is pH-dependent (dissociating at mildly acid pH), this reagent can be used in many ways to control what may otherwise be spontaneous and irreversible streptavidin:biotin interactions and may be particularly important to allow "annealing" in extended 2D assemblies. A second approach involves a reversible protecting group for 2 of the binding sites on streptavidin, a "streptavidin macromolecular adapter protein" or "SAMA". This construct offers a level of controlled nanostructure assembly, as, for example, illustrated in FIG. 2, for example, for assembling an extended strut. The SAMA is based on a dimeric protein, having 2 ATP binding sites that are geometrically complementary to 2 biotin binding sites on streptavidin, that has been additionally engineered to incorporate two cysteine residues that can be subsequently biotinylated to regenerate streptavidin binding capability while preserving overall strut geometry.

FIG. 10 shows additional reagents and modular components useful in functional nanoassembly fabrication, including a variant dimeric ATP-binding protein (FIG. 10h) (e.g., a SAMA) incorporating fused, IgG-binding protein-G domains. Biotinylated IgG binding domains that can be directly connected to streptavidin via biotinylation linkers (FIG. 10) are available from research biochemical suppliers (www.piercenet.com) as are additional reagents (www.quantabiodesign.com) and antibodies outlined in FIG. 10. Reagents and protein components for nanoassembly fabrication shown in FIG. 10 are as follows. Part a shows a schematic illustration of streptavidin with 4 biotin binding sites. Part b shows an engineered streptavidin (Streptavipol) incorporating 4 surface cysteine sites aligned along a molecular dyad axis, so that they are geometrically complementary with 2 biotin binding sites on streptavidin. Part c shows show a streptavidin macromolecular adaptor (SAMA) based on an engineered form of a dimeric ATP binding protein. Part d shows an SH-reactive biotinylation reagent. Part e shows an SH-reactive azido-ATP linking reagent. Part f shows a biotin-azido-ATP bifunctional crosslinking reagent. Part h shows a dimeric ATP binding protein incorporating a protein-G IgG binding domain. Part g shows biotinylated Protein G. Parts i,j show two different IgG molecules.

In an embodiment, immobilized antibody arrays are generated (for example, the immobilized species can be IgGs, Fabs, or single-chain Fvs, depending on the application) with controlled geometry.

Figure 11:
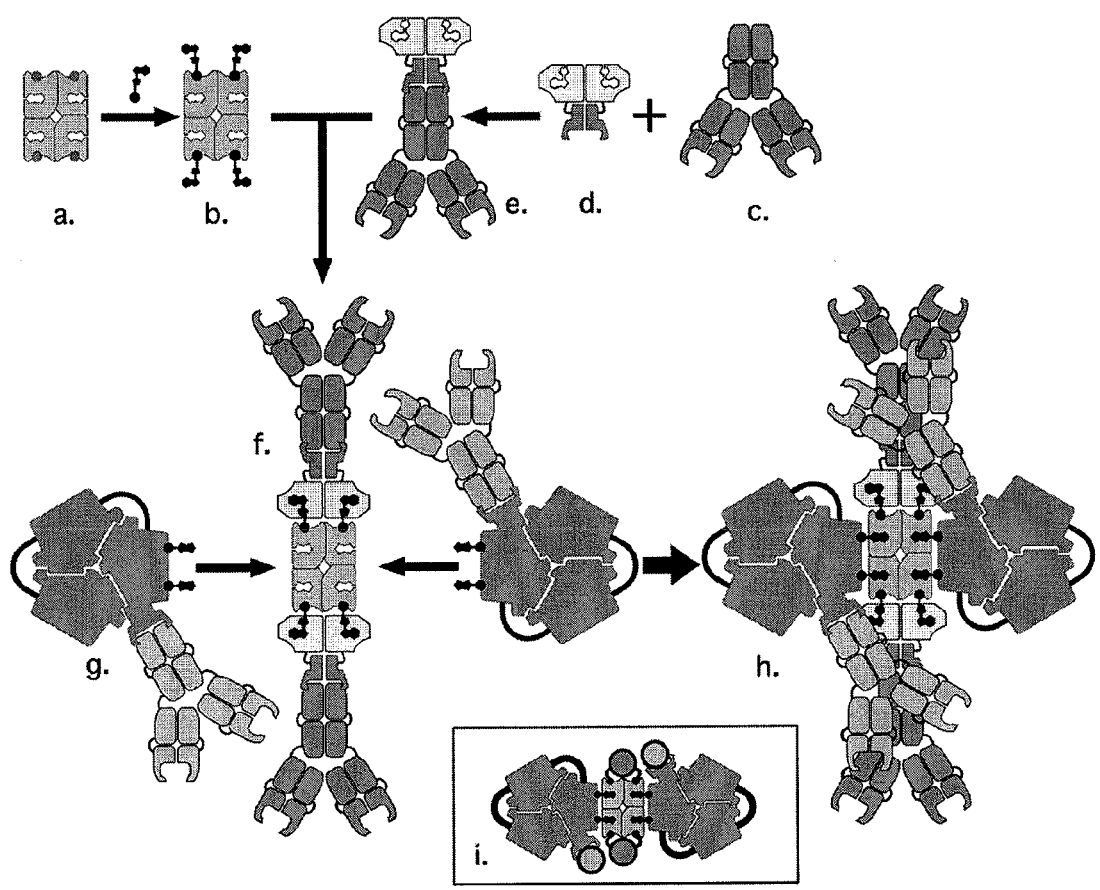
FIG. 11 illustrates a convergent method for assembling functionalized nanostructures.

Improvements in detector affinity and specificity can be associated with organized, high density immobilization of IgGs on sensor array surfaces (e.g., Soukka et al., Anal. Chem., v.73 (2001) pp. 2254-2260). With the constructs and devices presented herein one can control and precisely position the relative orientation of two (or ultimately more) IgG molecules to a substrate surface, e.g., attach to different epitopes of an antigen simultaneously. FIG. 11 illustrates how some of the components described above can be used in a convergent synthesis to assemble a small component incorporating 2 pairs of different antibodies in close proximity. Part a shows a Streptavipol (FIG. 10b) tetramer reacting with a thiol-reactive azido-ATP reagent to produce an azido-ATP modified Streptavipol tetramer. Parts c and d show the interaction between a given IgG and a dimeric ATP-binding protein incorporating fused Protein-G domains, to form the complex Part e. Two moles of Part e can associate with the Streptavipol and subsequently be photo-crosslinked to form the element of part f. Part f can then bind two C3-single chain nodes with fused IgG binding domains and attached IgG molecules to form the structure in Part h, incorporating two sets of two different antibodies in close proximity to each other. The structures of Streptavipol and a trimeric single-chain fusion (see, e.g., FIG. 7) can orient the IgGs in a direction normal to the plane of the page in which the schematic is drawn as illustrated in the inset part i. and used in FIG. 12.

The capture agent resulting from the process shown in FIG. 11 can be used as a sensor device, because the binding of a hapten would "freeze" the relative orientations of the bound IgGs (whose interdomain connections are otherwise quite flexible), an effect that can be detected using a variety of biophysical methods such as fluorescence resonance energy transfer FRET (http://en.wikipedia.org/wiki/Fluorescence_resonance_energy_transfer) or other methods. Because the single-chain C3 nodes shown in FIG. 11 incorporate terminal orienting His-tags, the structures are readily immobilized on, for example, Ni-resins, coated metal surfaces, or self-assembling membrane (SAM) surfaces that incorporate a Ni-chelating lipid Ni-NTA-DOGA (Ni-2-(bis-carboxymethyl-amino)-6[2-(1,3)-di-O-oleyl-glyceroxy)-acetyl-amino] hexanoic acid).

Figure 12:
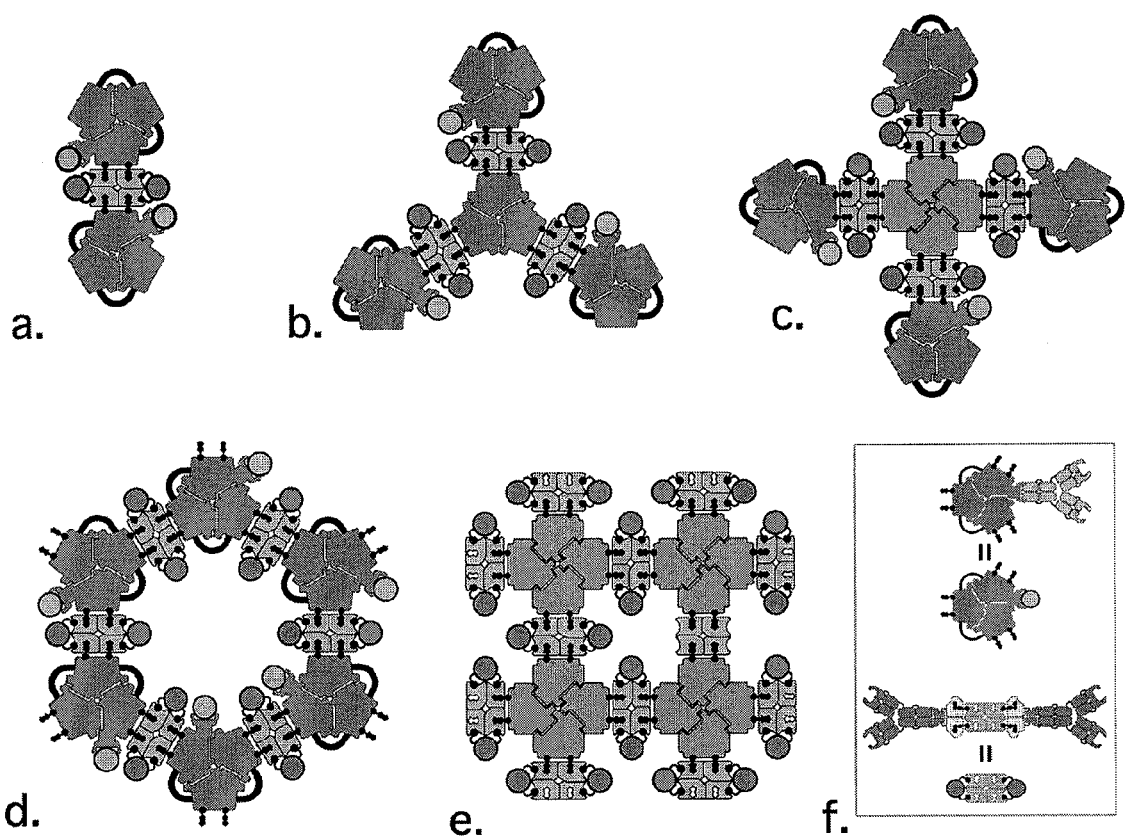
FIG. 12 illustrates nanostructures functionalized with bound antibodies.

Examples of nanostructures functionalized with either one or two different IgG molecules that can be constructed using the basic component system are illustrated in FIG. 12. FIG. 12a schematically recapitulates the assembly whose construction was outlined in FIG. 11. FIGS. 12b,c show assemblies built on C3 and C4 nodes respectively. Construction of such assemblies can proceed via the initial immobilization of the central C3 or C4 nodes through their terminal His-tags, followed by attachment of Streptavipol:IgG conjugates, and subsequently, attachment of single-chain C3 nodes incorporating IgG binding domains, from which the terminal His-tags have first been removed. FIG. 12d shows a hexagonal structure composed of Streptavipol:IgG conjugates and single-chain C3 nodes incorporating IgG binding domains. FIG. 12e shows a square 2D lattice constructed of Streptavipol:IgG conjugates and C4-symmetric nodes. The assembly of structures such as those shown in FIGS. 12e,f can be approached using "pH-annealable" iminobiotin conjugated nodes, linked through their terminal His-tags to the Ni-chelating lipid Ni-NTA-DOGA, and free to undergo 2-dimensional diffusion on a SAM surface. FIG. 12f shows alternative schematic representations of the Streptavipol:IgG conjugate and C3 single-chain IgG conjugate modules.

A flexible set of nanoassembly components and modules can allow the construction of functionalized lattice structures, such as those illustrated in FIG. 12. This can enable new functional applications. Some applications of this technology are using the components to facilitate the assembly of diagnostic devices and sensors incorporating multiple molecular detectors whose relative geometry and stoichiometry are precisely controlled. An advantage of such structures is that they potentially offer much greater detection sensitivity and specificity than a detection system incorporating a single antibody (or single-chain Fv, etc.), because two different antibodies can be geometrically constrained, so that they potentially interact with the same antigen simultaneously. Thus, detection sensitivity and specificity can be improved, which can be useful for protein marker diagnostics.

Applications for nanocomponents as presented herein include biomedical diagnostics, proteomics and nanotechnology, including, for example, "personalized" approaches to medicine based on the analysis of specific disease-related protein biomarkers. This technology can enable advancement in the protein biomarker space, for example, with biosensor applications, such as those outlined in FIG. 12. The components can "snap" together to form functionalized structures like those shown in FIG. 12. These protein components can be used for nanodevice fabrication, for example, protein-based nanostructures for large-scale applications such as active membranes for water purification.

A substantially Cn-symmetric protein structure or node can include a protein structure or node which, for the most part, exhibits Cn-rotational symmetry, although a few atoms, groups of atoms, or amino acid residues may differ from the symmetric scheme. For example, the C3 and C4 symmetric nodes formed of single chains in FIG. 4 can be considered to be substantially C3 and C4 symmetric, respectively, even though some subunits of a given node may differ from other subunits of that node, in that some subunits have biotins linked to their exterior surface whereas other subunits do not have biotins linked to their exterior surface.

A subunit of a protein node can include a group of amino acid residues that are closely associated with each other, for example, in spatial proximity and/or through intermolecular and/or interatomic forces, such as covalent bonds, disulfide bridges, electrostatic forces, hydrophobic forces, and/or van der Waals forces. A given subunit can have tertiary protein structure. Several subunits can aggregate to form a protein node having quaternary protein structure. The subunits that form a node can associate with each other through noncovalent forces, e.g., electrostatic forces, hydrophobic forces, and/or van der Waals forces, to form the node. Two or more subunits that form a node may or may not be covalently linked to each other, e.g., through polymeric or oligomeric amino acid chains.

"Linked" and "bound" can refer, for example, to an association of a molecule, a portion of a molecule, a group of atoms, or an atom with another molecule, portion of a molecule, group of atoms, or atom. The "linked" or "bound" state can arise from covalent, ionic, hydrophobic, van der Waals, or other types of interactions or forces.

A "subunit" can refer, for example, to a portion of a molecule, or a portion of a multimeric structure.

This application claims the benefit of U.S. Provisional Application No. 61/177,256, filed May 11, 2009, the specification of which is hereby incorporated by reference in its entirety.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

References

Drexler, K E "Nanosystems: Molecular Machinery, Manufacturing, and Computation" Wiley Interscience (1992)

International Technology Roadmap for Semiconductors (http://www.itrs.net/reports.html)

Lakowicz, J R "Principles of Fluorescence Spectroscopy", Plenum Publishing Corporation, 2nd edition (Jul. 1, 1999)

Phillips, R & Quake, S R "The Biological Frontiers of Physics" Physics Today (May 2006) p38-43

Smith, E A, Corn, R M. Surface Plasmon Resonance Imaging as a Tool to Monitor Biomolecular Interactions in an Array Based Format. Appl. Spectroscopy, 2003, 57, 320A-332A.

We claim:

1. A protein nanostructure comprising,
a protein node;
a selectively patterned surface comprising at least one fixation site, the protein node bound with the at least one fixation site
a second protein node,
wherein the protein node comprises an interaction domain and the second protein node comprises a second interaction domain and
wherein the interaction domain of the protein node interacts with the second interaction domain of the second protein node;
a streptavidin bound to an adaptor protein comprising a binding domain; and
an antibody protein,
wherein the antibody protein is bound to the binding domain and
wherein the streptavidin is bound to the protein node.

2. The protein nanostructure of claim 1, wherein the selectively patterned surface comprises a solid surface.

3. The protein nanostructure of claim 1, further comprising a second antibody protein,
wherein the protein node comprises a second binding domain and
wherein the second antibody protein is bound to the binding domain.

4. The protein nanostructure of claim 3, wherein the second binding domain comprises a Protein G domain.

5. The protein nanostructure of claim 1,
wherein the protein node is selected from the group consisting of a substantially C3-symmetric, substantially C4-symmetric, and substantially C6-symmetric protein node and
wherein the second protein node is selected from the group consisting of a substantially C3-symmetric, substantially C4-symmetric, and substantially C6-symmetric protein node.

6. The protein nanostructure of claim 1,
wherein the selectively patterned surface comprises a solid surface selected from the group consisting of silicon, silicon oxide, carbon, graphene, and a semiconductor,
wherein the at least one fixation site comprises an atom or cluster of atoms, selected from the group consisting of a metal, a noble metal, and gold deposited onto the surface,
wherein the protein node comprises a terminal cysteine group, and
wherein the terminal cysteine group is bound to the fixation site.

7. The protein nanostructure of claim 1, further comprising a second streptavidin; and
a third protein node,
wherein the second streptavidin is bound to the second protein node and
wherein the second streptavidin is bound to the third protein node.

8. An extended structure, comprising
a plurality of protein nanostructures of claim 1 on the selectively patterned surface.

9. A method of assembling a protein nanostructure, comprising:
providing a protein node;
providing a surface;
selectively patterning the surface with a fixation site;
bringing the protein node into contact with the surface; and
allowing the protein node to bond with the fixation site, so that a position and/or orientation of the protein node is constrained
providing a second protein node;
wherein the protein node comprises an interaction domain and the second protein node comprises a second interaction domain;
allowing the interaction domain of the protein node to interact with the second interaction domain of the second protein node;
providing a streptavidin;
providing an adaptor protein comprising a binding domain;
binding the streptavidin to the adaptor protein;
providing an antibody protein;
binding the antibody protein to the binding domain; and
binding the streptavidin to the protein node.

10. The method of claim 9, wherein the protein node bound with the fixation site rotates about an axis normal to the surface.

11. The method of claim 10, wherein the interaction of the interaction domain of the protein node with the second interaction domain of the second protein node locks the protein node into a final desired orientation on the surface.

12. The method of claim 9, wherein the surface is selectively patterned with the fixation site by depositing a metal, a noble metal, or a gold atom or cluster of atoms onto the surface with an atomic force microscope tip.

13. The method of claim 9,
   wherein the interaction between the interaction domain of the first protein node and the interaction domain of the second protein node has a strength and
   wherein the strength of the interaction is dependent on an external condition selected from the group consisting of pH, temperature, chemical species concentration, light, radiation, electric field, and magnetic field.

\* \* \* \* \*